United States Patent [19]

Nilssen

[11] Patent Number: 5,440,209
[45] Date of Patent: Aug. 8, 1995

[54] DRIVEN FULL-BRIDGE INVERTER BALLAST

[76] Inventor: Ole K. Nilssen, 408 Caesar Dr., Barrington, Ill. 60010

[21] Appl. No.: 115,586

[22] Filed: Sep. 3, 1993

Related U.S. Application Data

[63] Continuation-in-part of Ser. No. 63,075, May 10, 1993, which is a continuation-in-part of Ser. No. 20,696, Feb. 22, 1993, abandoned, which is a continuation-in-part of Ser. No. 840,528, Feb. 25, 1992, Pat. No. 5,189,342, which is a continuation of Ser. No. 646,497, Jan. 28, 1991, which is a continuation of Ser. No. 107,795, Oct. 13, 1987, abandoned, which is a continuation-in-part of Ser. No. 658,423, Oct. 5, 1984, abandoned, which is a continuation-in-part of Ser. No. 555,426, Nov. 23, 1983, abandoned, which is a continuation of Ser. No. 178,107, Aug. 14, 1980, abandoned, which is a continuation-in-part of Ser. No. 973,741, Dec. 28, 1978, abandoned, which is a continuation-in-part of Ser. No. 890,586, Mar. 20, 1978, Pat. No. 4,184,128.

[51] Int. Cl.[6] .............................................. H05B 41/29
[52] U.S. Cl. ................................... 315/219; 315/226; 315/DIG. 5
[58] Field of Search ................. 315/94, 97, 98, 105, 315/209 R, 210, 219, 224, 226

[56] References Cited

U.S. PATENT DOCUMENTS

| | | | |
|---|---|---|---|
| 4,388,563 | 6/1983 | Hyttin | 315/226 X |
| 4,396,866 | 8/1983 | Bay et al. | 315/97 X |
| 4,408,270 | 10/1983 | Anderson et al. | 315/219 X |

*Primary Examiner*—David Mis

[57] ABSTRACT

In an electronic ballast for Rapid-Start fluorescent lamps, each one of two of the four transistors in a full-bridge inverter is driven from a commercially available timer by way of simple diode-resistor parallel-combination. Each one of the other two transistors is driven directly from an auxiliary winding on the full-bridge inverter's power output transformer. The fluorescent lamps are series-connected with a current-limiting inductor to form a series-combination; which series-combination is connected across an output winding of the power output transformer. Heating voltage for each of the lamps' cathodes is obtained by way of two series-connected windings: one one the power output transformer and one on the current-limiting inductor. The magnitude of the resulting cathode heating voltage is substantially higher prior to lamp ignition as compared with after lamp ignition.

27 Claims, 12 Drawing Sheets

| Fig. 5A | Fig. 5B |

| Fig. 7A | Fig. 7B |

5,440,209

DRIVEN FULL-BRIDGE INVERTER BALLAST

RELATED APPLICATIONS

This application is a Continuation-in-Part of Ser. No. 08/063,075 filed May 10, 1993; which is a Continuation-in-Part of Ser. No. 08/020,696 filed Feb. 22, 1993, now abandoned; which is a Continuation-in-Part of Ser. No. 07/840,528 filed Feb. 25, 1992, now U.S. Pat. No. 5,189,342; which is a Continuation of Ser. No. 07/646,497 filed Jan. 28, 1991; which is a Continuation of Ser. No. 07/107,795 filed Oct. 13, 1987, now abandoned; which is a Continuation-in-Part of Ser. No. 06/658,423 filed Oct. 5, 1984, now abandoned; which is a Continuation-in-Part of Ser. No. 06/555,426 filed Nov. 23, 1983, now abandoned; which is a Continuation of Ser. No. 06/178,107 filed Aug. 14, 1980, now abandoned; which is a Continuation-in-Part of Ser. No. 05/973,741 filed Dec. 28, 1978, now abandoned; which is a Continuation-in-Part of Ser. No. 05/890,586 filed Mar. 20, 1978, now U.S. Pat. No. 4,184,128.

BACKGROUND OF THE INVENTION

Field of the Invention

Instant invention relates to an electronic ballast including a driven full-bridge inverter.

SUMMARY OF THE INVENTION

Objects of the Invention

An object of the present invention is that of providing cost-effective electronic ballasts for gas discharge lamps.

This, as well as other objects and advantages of the present invention will become apparent from the following description.

Brief Description

In an electronic ballast for Rapid-Start fluorescent lamps, each one of two of the four transistors in a full-bridge inverter is driven from a commercially available timer {such as timer TLC556 from Texas Instruments ("TI")} by way of a simple diode-resistor parallel-combination. Each one of the other two transistors is driven directly from an auxiliary winding on the full-bridge inverter's power output transformer.

The fluorescent lamps are series-connected with a current-limiting inductor to form a series-combination; which series-combination is connected across an output winding of the power output transformer.

Heating voltage for each of the lamps' cathodes is obtained by way of two series-connected windings: one one the power output transformer and one on the current-limiting inductor. The magnitude of the resulting cathode heating voltage is substantially higher prior to lamp ignition as compared with after lamp ignition.

Figures 3, 3A:
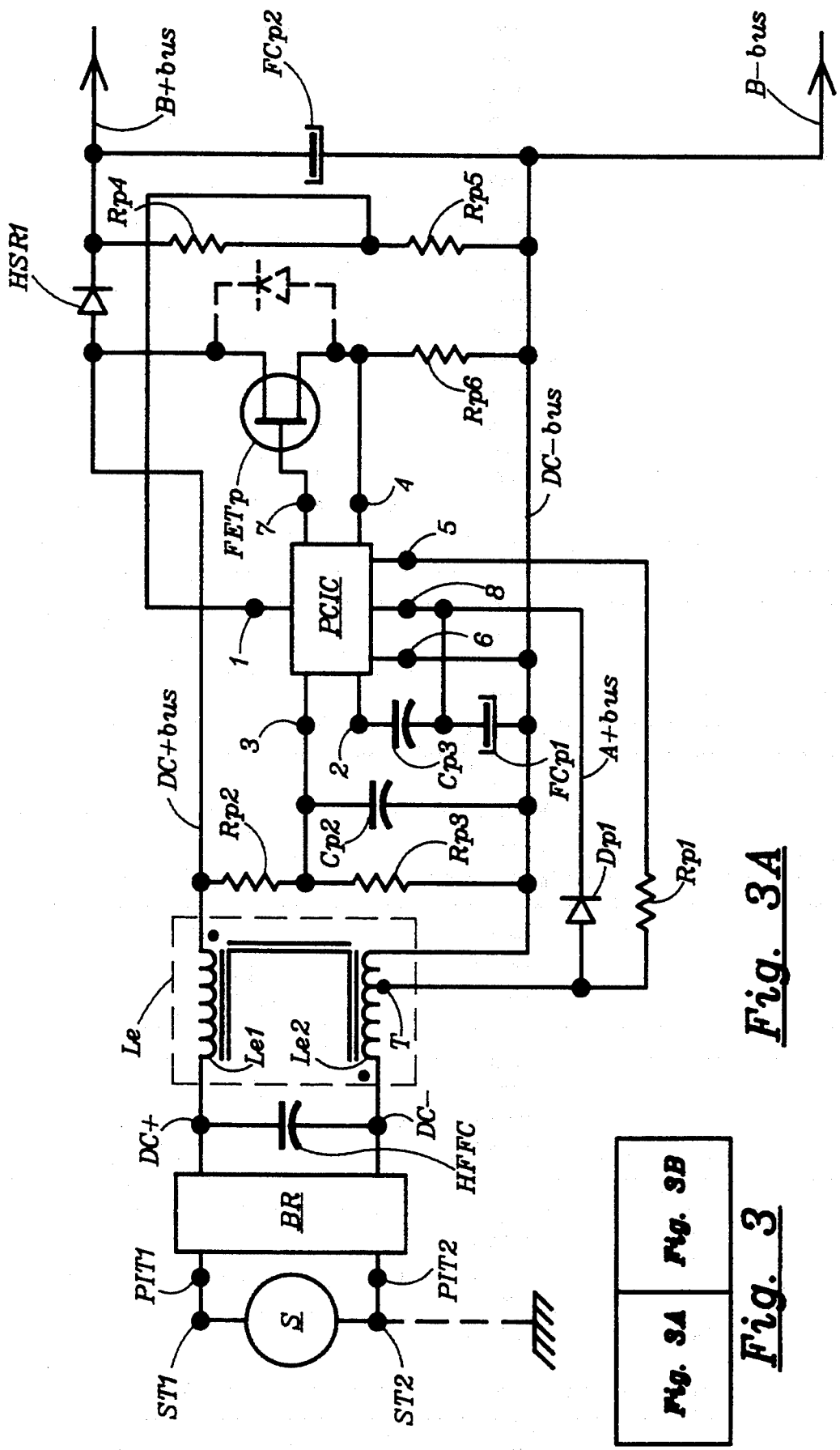
FIG. 3, which is a key to a two-part drawing consisting of FIGS. 3A and 3B, schematically illustrates a second embodiment of a full-bridge inverter-type electronic ballast circuit; which second embodiment consists of two separate parts: a Pre-Converter Circuit, which is represented by FIG. 3A; and a Bridge Inverter Circuit, which is represented by FIG. 3B.

FIGS. (4key, 4A waveforms, 4B other waveforms) show various voltage and current waveforms associated with the embodiment of FIG. 3.

Figure 6:
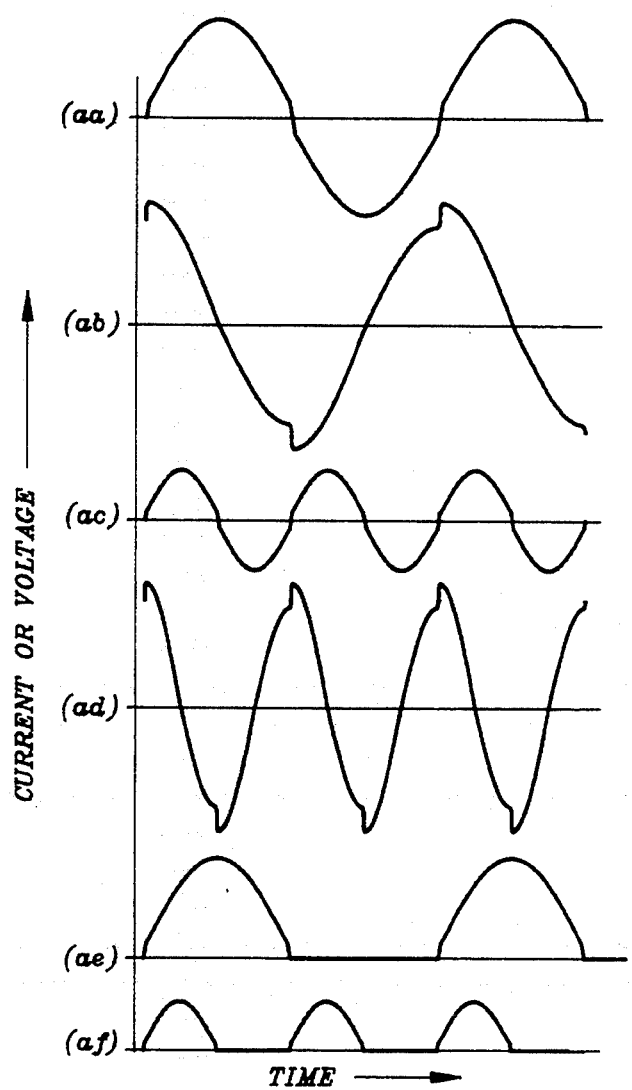
Figure 4B:
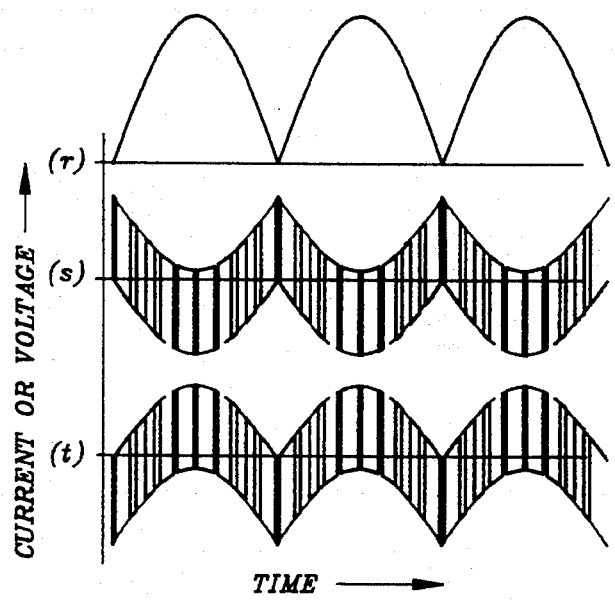
Figures 5, 5A:
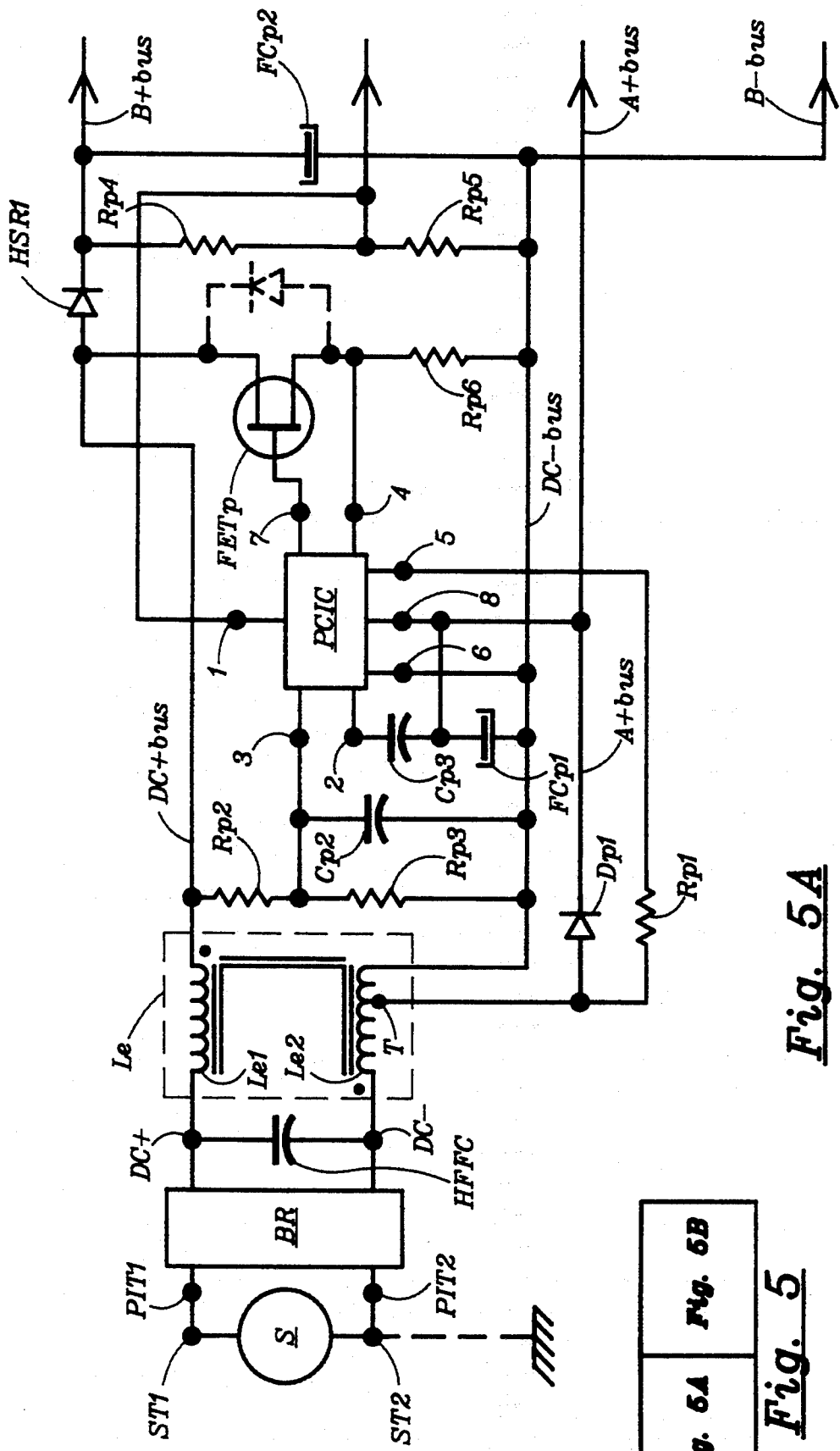
Figure 5B:
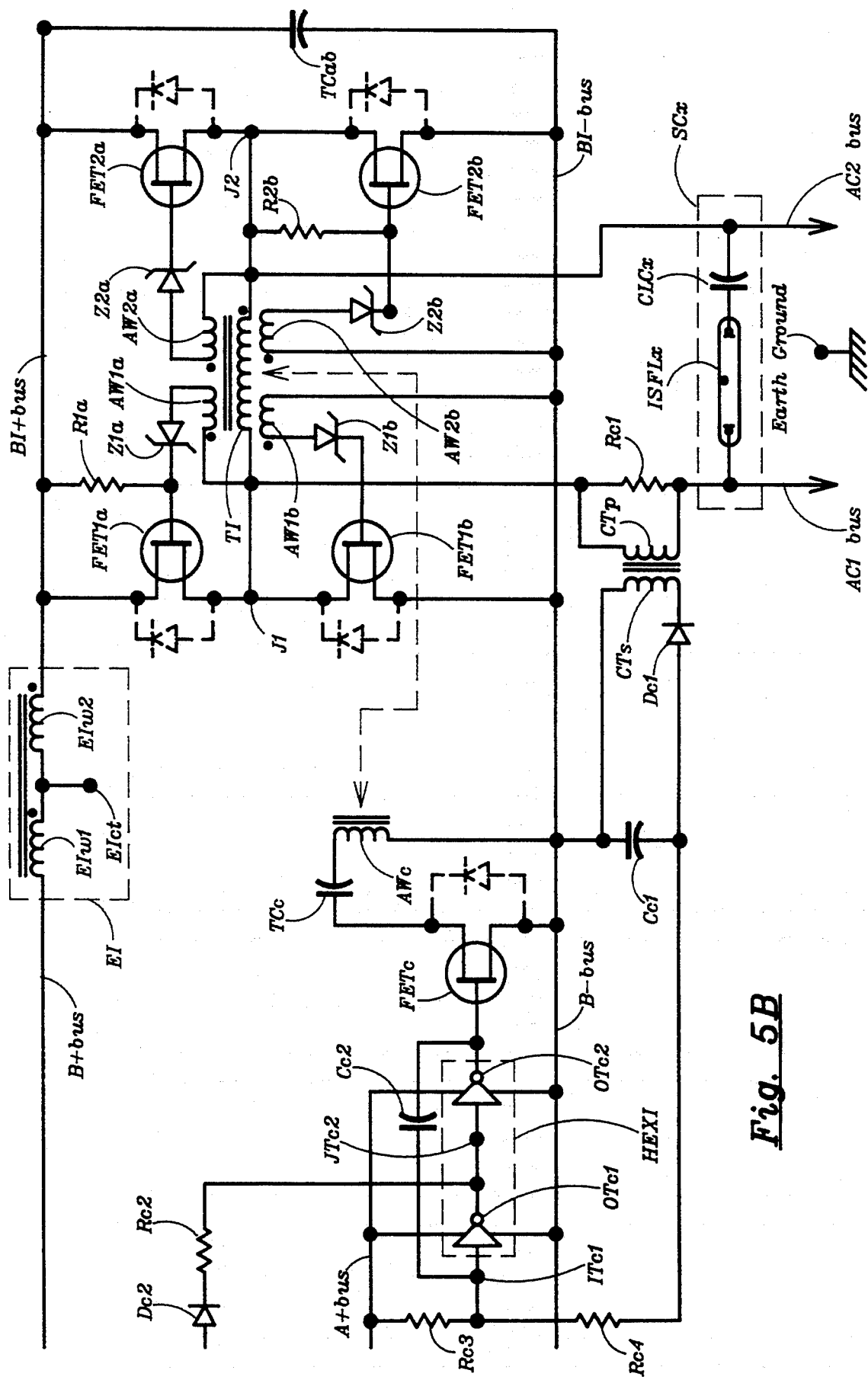

FIG. 5, which is a key to a two-part drawing consisting of FIGS. 5A and 5B, illustrates an alternative second embodiment; which alternative second embodiment consists of two separate parts: a Pre-Converter Circuit, which is represented by FIG. 5A; and a Bridge Inverter Circuit, which is represented FIG. 6 shows various voltage and current waveforms associated with the embodiment of FIG. 5.

Figures 7, 7A:
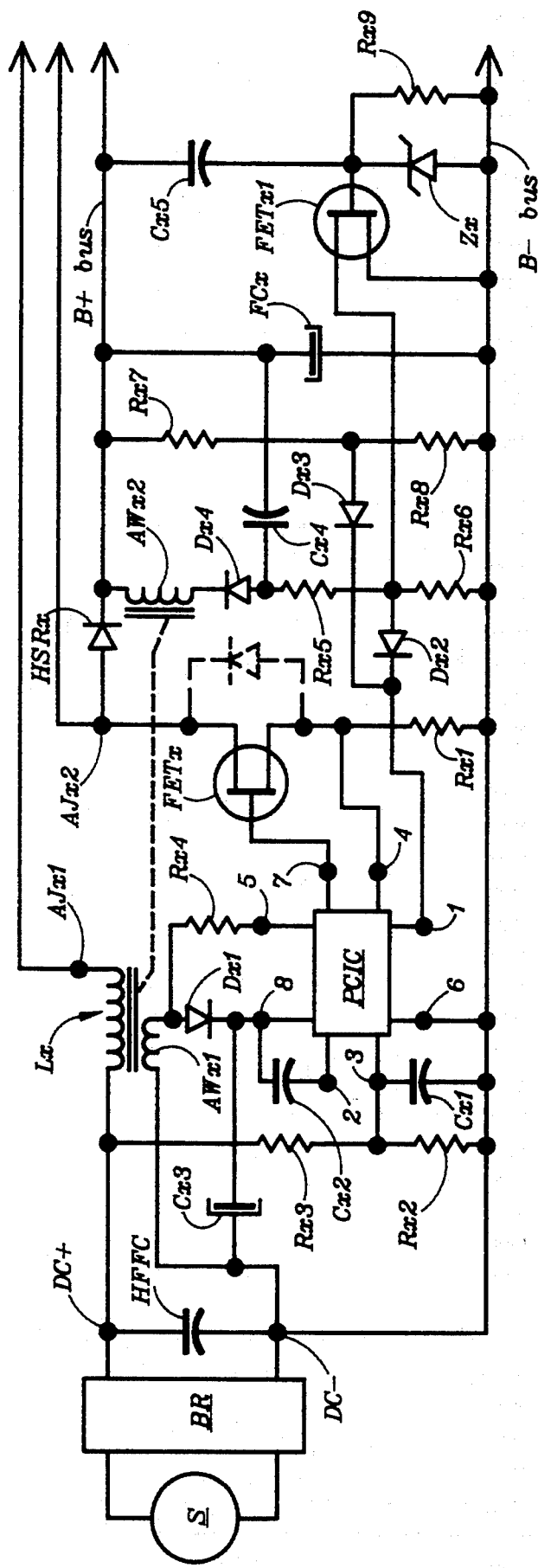
Figure 7B:
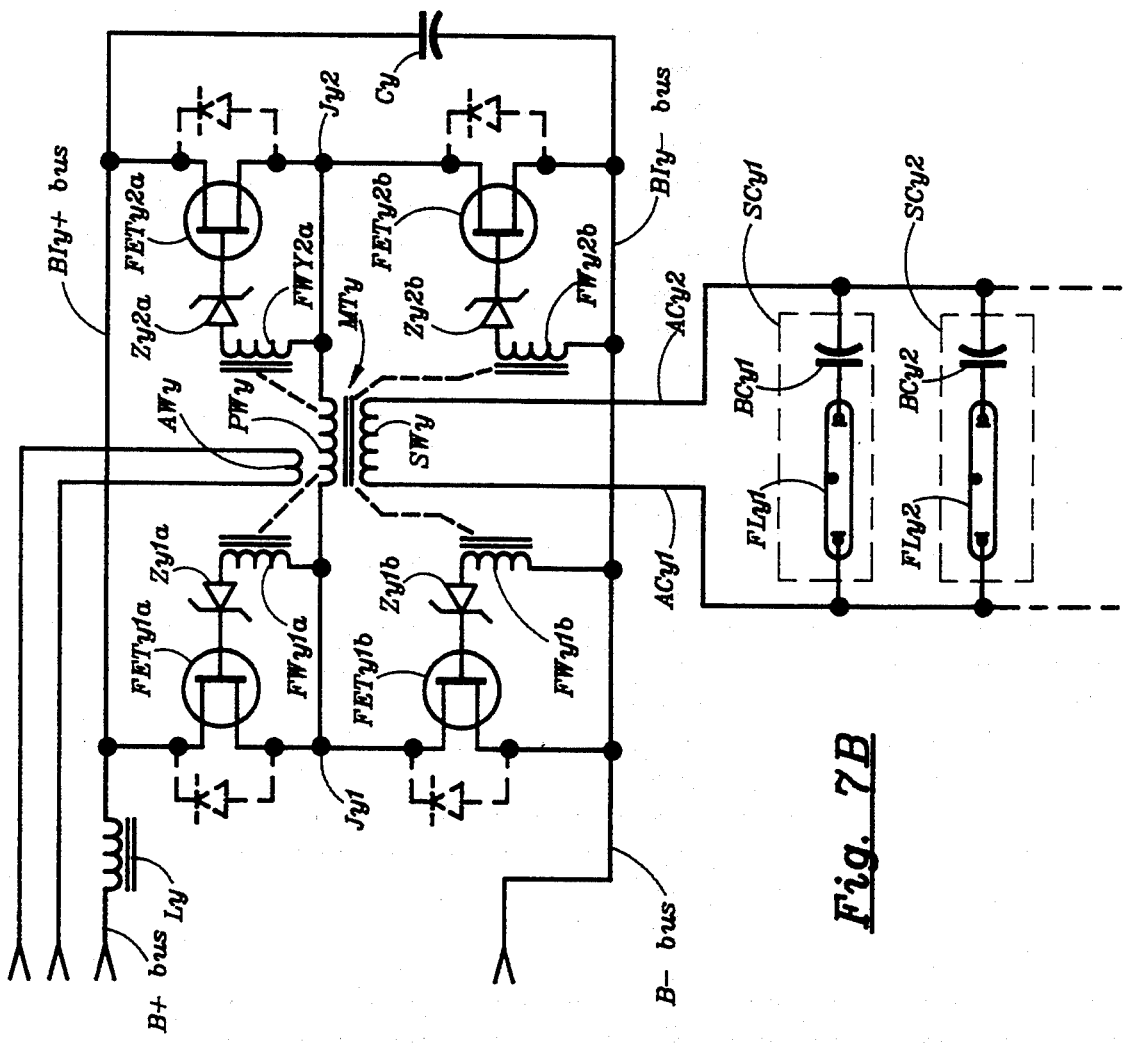

FIG. 7, which is a key to a two-part drawing consisting of FIGS. 7A and 7B, illustrates a third embodiment of a full-bridge inverter-type electronic ballast; which third embodiment consists of two separate parts: a Pre-Converter Circuit, which is represented by FIG. 7A; and a Bridge Inverter Circuit, which is represented by FIG. 7B.

Figure 8:
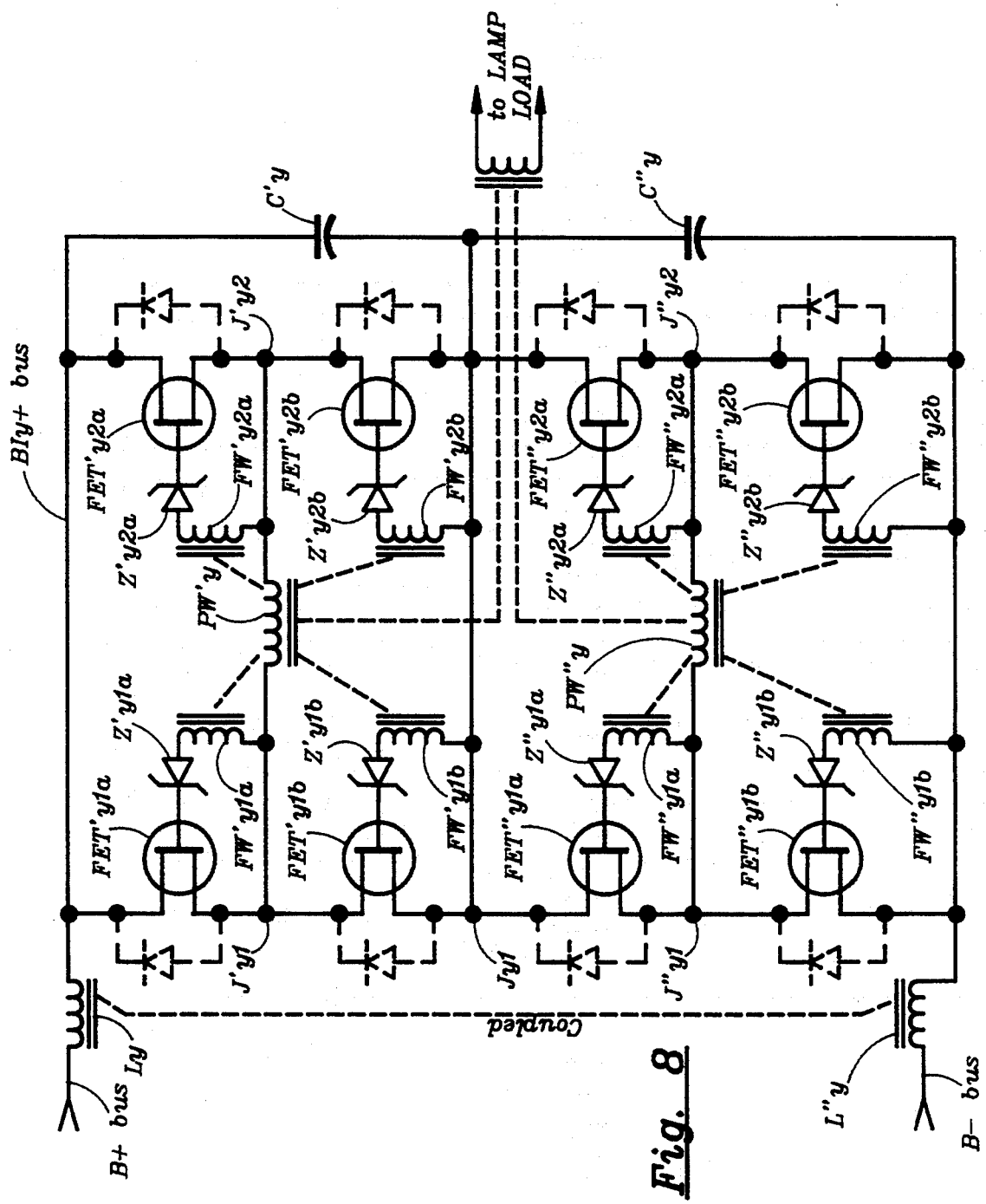

FIG. 8 illustrates a fourth embodiment of a full-bridge inverter-type ballast circuit.

Figure 9:
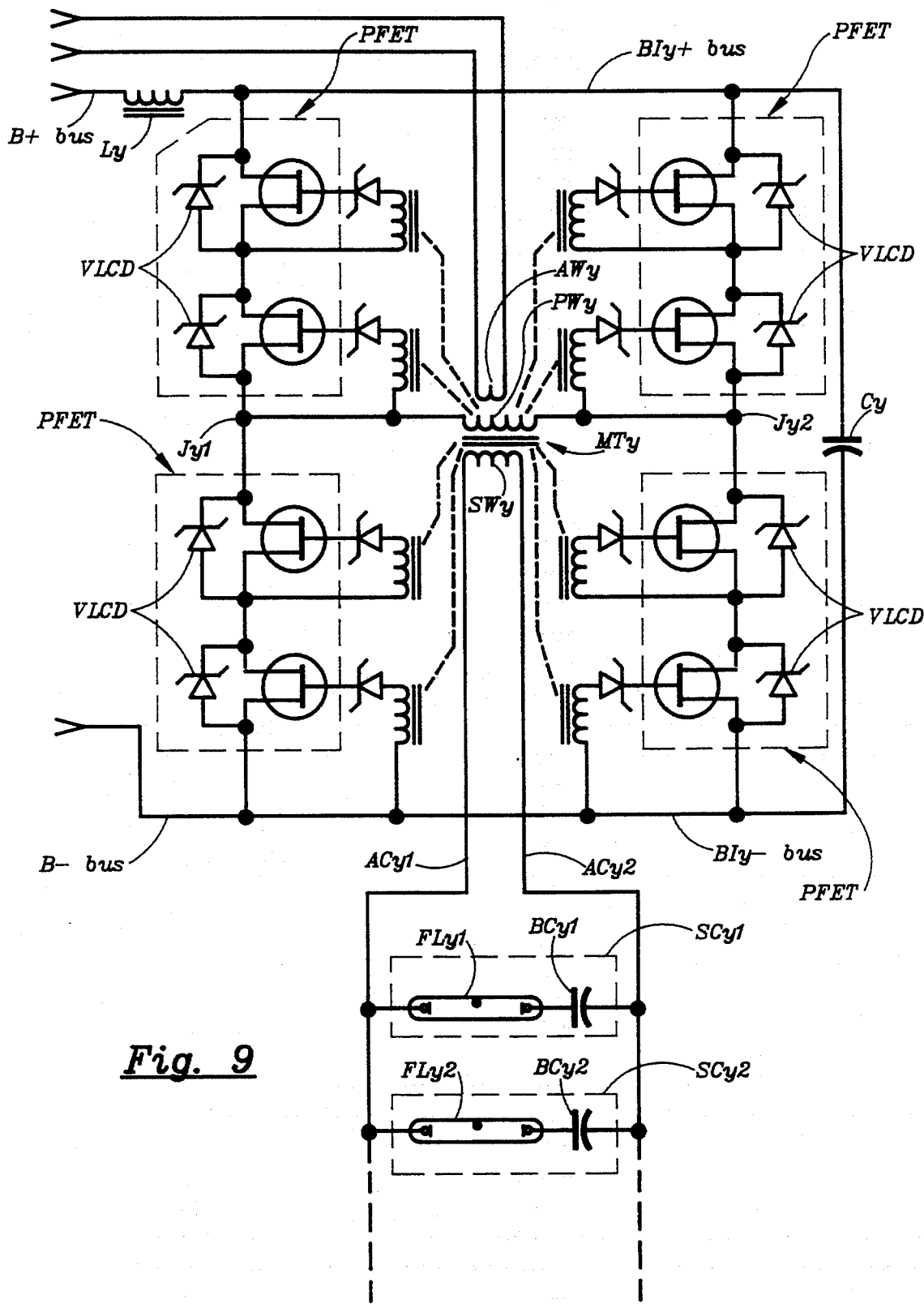

FIG. 9 illustrates a fifth embodiment of a full-bridge inverter-type ballast circuit.

Figure 10:
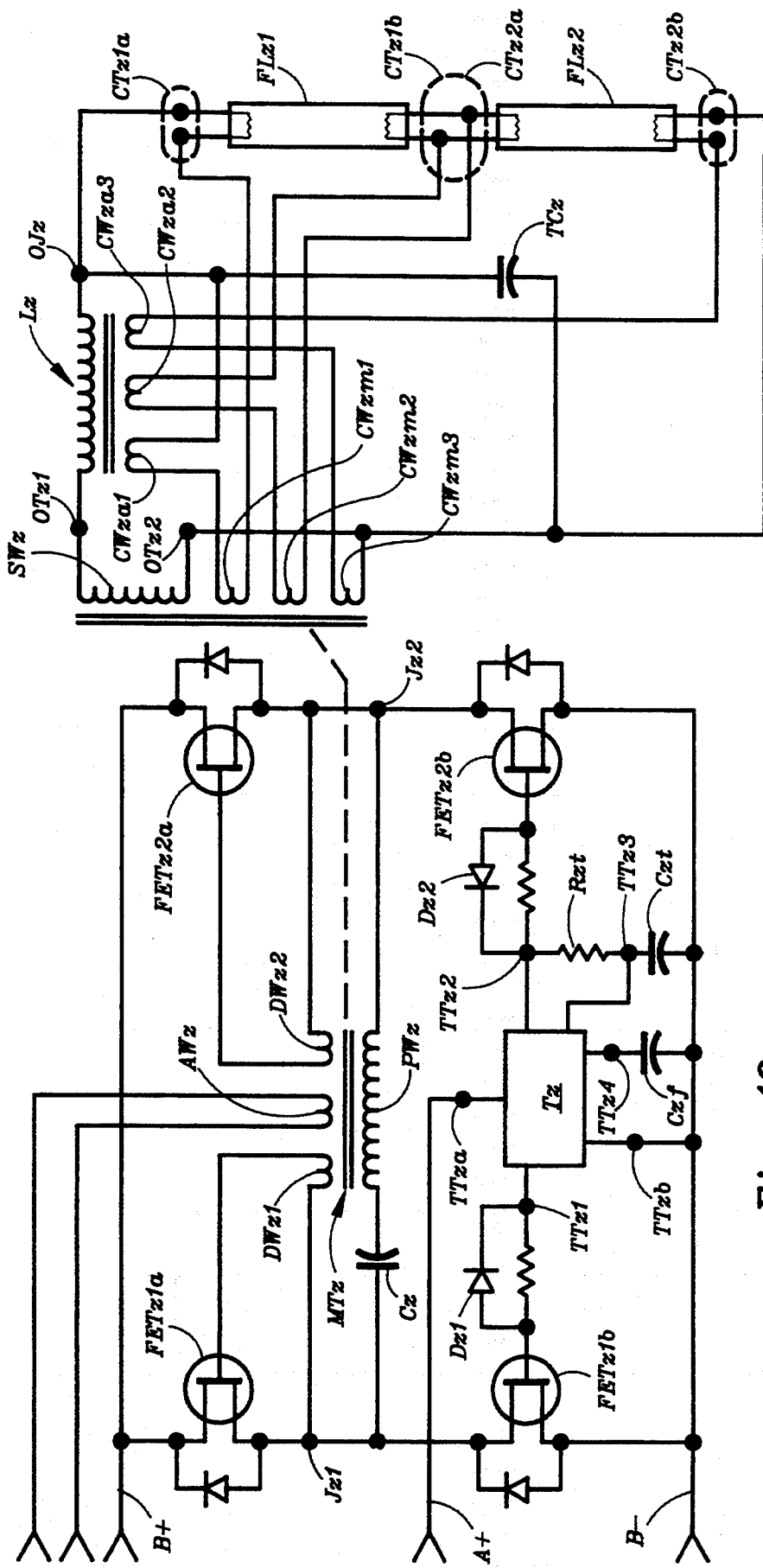

FIG. 10 illustrates the preferred embodiment of the present invention.

DESCRIPTION OF THE FIRST EMBODIMENT

Details of Construction of First Embodiment

Figure 1:
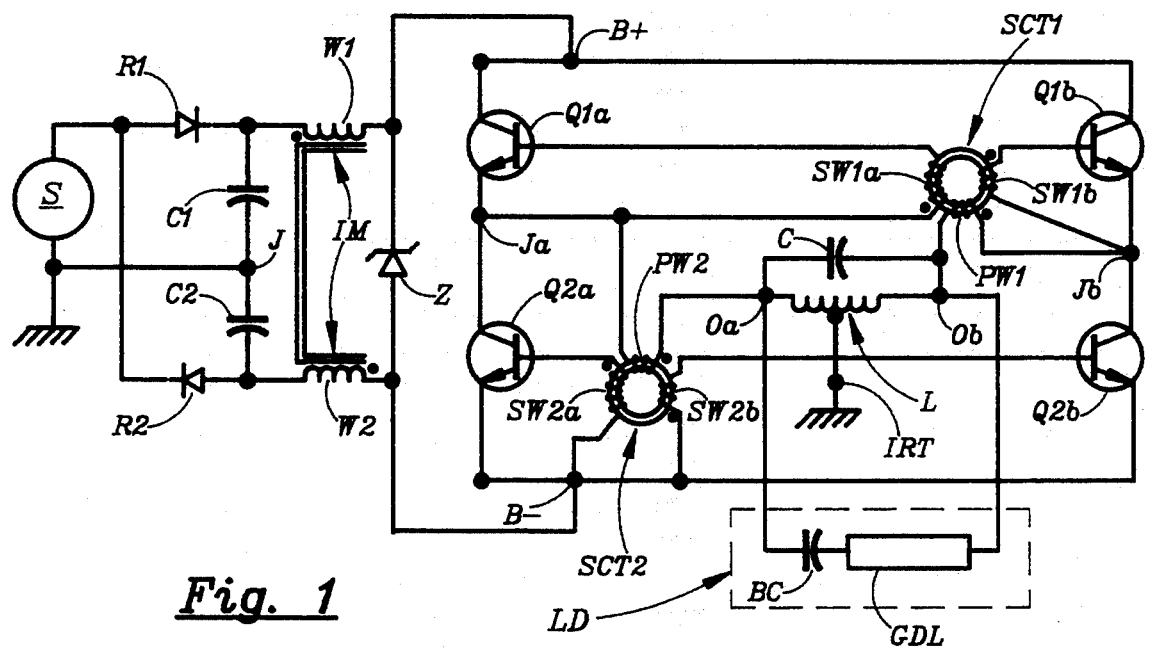
FIG. 1 illustrates a first embodiment of a full-bridge inverter-type electronic ballast circuit.

FIG. 1 shows an AC power supply S, which in reality is an ordinary 120 Volt/60 Hz electric utility power line.

One terminal of power supply S is grounded and also directly connected to a junction J between two energy-storing capacitors C1 and C2. The other terminal of power supply S is connected to the anode of a rectifier R1 and to the cathode of a rectifier R2. Rectifier R1 has its cathode connected to one terminal of C1—the other terminal of C1 being connected to junction J. Rectifier R2 has its anode connected to one terminal of C2—the other terminal of C2 being connected to junction J.

An inductor means IM has two equal but separate windings W1 and W2: W1 is connected between the cathode of rectifier R1 and a junction B+ between the collectors of two transistors Q1a and Q1b; W2 is connected between the anode of R2 and a junction B− between the emitters of two transistors Q2a and Q2b.

A Zener diode Z is connected between junction B+ and junction B−.

Transistor Q1a is connected with its emitter to a junction Ja, as is also the collector of transistor Q2a. Transistor Q1b is connected with its emitter to a junction Jb, as is also the collector of transistor Q2b.

A center-tapped inductor L is connected between inverter output terminals Oa and Ob. Connected in parallel with L is a capacitor C. The center-tap on inductor L, which is referred-to as inverter reference terminal IRT, is grounded.

Primary winding PW1 of saturable current-transformer SCT1 is connected between junction Jb and output terminal Ob. Primary winding PW2 of saturable current-transformer SCT2 is connected between junction Ja and output terminal Oa.

One secondary winding SW1a of transformer SCT1 is connected between the base and the emitter of transistor Q1a; another secondary winding SW1b of transformer SCT1 is connected between the base and the emitter of transistor Q1b.

One secondary winding SW2a of transformer SCT2 is connected between the base and the emitter of transistor Q2a; another secondary winding SW2b of transformer SCT2 is connected between the base and the emitter of transistor Q2b.

A series-combination of a ballasting capacitor CB and a gas discharge lamp GDL constitutes a load LD; which load is connected across output terminals Oa and Ob.

Details of Operation of First Embodiment

The operation of the full-bridge inverter circuit of FIG. 1 may be explained as follows.

Source S provides 120 Volt/60 Hz voltage to the voltage-doubling and rectifying/filtering circuit consisting of R1, R2, C1 and C2. A substantially constant DC voltage of about 320 Volt magnitude then results at the output of this circuit, with the positive side of this DC voltage being present at the cathode of R1 and the negative side being present at the anode of R2.

This substantially constant-magnitude DC voltage is applied by way of inductor means IM and its two windings W1 and W2, poled as indicated, to the DC power input terminals B+ and B− of the full-bridge inverter circuit comprising transistors Q1a, Q1b, Q2a and Q2b.

This inverter circuit is made to self-oscillate by way of positive current feedback provided by saturable current-transformers SCT1 and SCT2, poled as indicated. Thus, the magnitude of the current provided to any given transistor's base-emitter junction is proportional to the magnitude of the current flowing between output terminals Oa and Ob.

The frequency of inverter oscillation is determined by a combination of the saturation characteristics of the saturable current-transformers and the natural resonance frequency of the parallel L-C circuit (as combined with any tuning effects caused by the load connected thereacross).

The saturation characteristics of the saturable current-transformers are substantially identical to one another and so chosen that, when there is no load connected across output terminals Oa and Ob, the waveform of the output voltage is as indicated in FIG. 2a; which waveform is made up of sinusoidal half-waves of voltage, indicated by HW1 and HW2, interconnected with periods of zero-magnitude voltage, indicated by ZM1 and ZM2. This waveform is achieved by making the time-length of the saturation-time required for the saturable current-transformers to reach saturation longer than the time-length of one of the sinusoidal half-waves of voltage. The degree to which the time-length of the saturation-time is longer than the time-length of one of the sinusoidal half-waves of voltage corresponds to the time-length of the periods of zero-magnitude voltage.

In FIG. 2a, each of the sinusoidal half-waves of voltage represents the natural interaction between L and C as fed from a substantially constant current source.

In combination, the two separate but equal windings W1 and W2 of inductor means IM provide for a total inductance that is large enough so that the current flowing through the two windings and into the inverter remains substantially constant during a complete time-period of one cycle of the inverter's oscillation.

That is, the DC current flowing into the B+ junction and out of the B− junction is substantially constant during the interval between point X and point Y in FIG. 2a. Thus, whenever the L-C parallel circuit is connected between B+ and B−—which it is during the complete time-length of each of the sinusoidal half-waves of voltage—it is indeed fed from a substantially constant current source.

When a load impedance having a net component of capacitive reactance (such as does LD) is connected across the inverter's output terminals Oa and Ob, capacitive reactance is in effect added to the L-C parallel circuit; which results in the time-lengthening of the sinusoidal half-waves of voltage—as indicated by FIG. 2b. The more capacitance added this way, the more time-lengthening results.

On the other hand, when a load impedance having a net component of inductive reactance is connected between Oa and Ob, the result would be a time-shortening of the sinusoidal half-waves of voltage.

By having two different load impedances connected between Oa and Ob, and by having these two load impedances be of conjugate nature, there will be no net effect on the length of the period of the sinusoidal half-waves. For instance, by having another gas discharge lamp like GDL connected in series with an inductor having a reactance of the same absolute magnitude as that of CB, and by connecting this series-combination in parallel with load LD, the total net load impedance would be resistive and would cause no net shortening or lengthening of the sinusoidal half-waves of voltage.

By making the time-length of the saturation-time of the saturable current-transformers substantially equal to the time-length of one of the sinusoidal half-waves of voltage, the resulting output voltage will be as illustrated in FIG. 2c; which indicates that the net inversion frequency will now be the same as the natural resonance frequency of the L-C parallel circuit (as combined with whatever load impedance might be connected between Oa and Ob).

By making the time-length of the saturation-time of the saturable current-transformers shorter than the time-length of one of the sinusoidal half-waves of voltage, the resulting output voltage will be as illustrated in FIG. 2d; which indicates that the net inversion frequency will now be higher then the natural resonance frequency of the L-C circuit (as combined with whatever load impedance might be connected between Oa and Ob).

Additional Comments re First Embodiment (a) As long as the time-length of the saturation-time of the saturable current-transformers remains equal to or longer than the time-length of one of the sinusoidal half-waves of voltage, the net inversion frequency will not be affected by the addition or removal of a load impedance, such as LD of FIG. 1, regardless of the magnitude of the net reactive impedance thereby added to or subtracted from the L-C parallel circuit.

(b) The magnitude of the Zener voltage of Zener diode Z is chosen such as to be somewhat higher than the maximum magnitude of the peak voltage of the sinusoidal half-waves of voltage present across the inverter's output terminals Oa and Ob. That way, the Zener diode will not interfere with normal operation of the inverter; yet, it will prevent the magnitude of the peak voltages of the sinusoidal half-waves from substantially exceeding the normally occurring maximum magnitudes. Without the Zener diode, for various transient reasons (such as due to the sudden removal of a load)

the magnitude of the peak voltages of the sinusoidal half-waves would occasionally become substantially larger than the normally occurring maximum magnitudes; and that would either cause transistor destruction, or it would necessitate the use of very special transistors of exceptionally high voltage capabilities.

(c) Inductor L is center-tapped; which, in effect, provides for a center-tap between the inverter's output terminals Oa and Ob. This center-tap is grounded. In many applications, particularly in the case of fluorescent lamp ballasts, it is very valuable to have the output referenced to ground.

(d) Inductor L may be integrally combined with a center-tapped auto-transformer; in which case the output voltage can readily be provided at any desired magnitude, while maintaining a ground-connected center-tap.

(e) Inductor means IM may consist of two entirely independent inductors—with one inductor located in each leg of the power supply. In fact, it is even acceptable under some circumstances to use but a single inductor in just one leg of the power supply; in which case, however, it would not be possible to connect the output's center-tap with the power supply's center-tap.

(f) It is not necessary to power the inverter of FIG. 1 from a voltage doubler. However, doing so provides for the advantage in many situations of being able to reference the center-tap of the inverter's output with one of the legs of the power line.

(g) The inverter of FIG. 1 must be triggered into oscillation. This triggering may be accomplished by way of providing a special trigger winding on each of the feedback current-transformers, and then to discharge a capacitor through these trigger windings. This may be done automatically with an arrangement consisting of a capacitor-resistor combination connected between B+ and B−, and a Diac for discharging the capacitor through the trigger windings.

(h) Finally, it is noted that the average absolute magnitude of the AC voltage appearing between inverter output terminals Oa and Ob must be substantially equal to the magnitude of the DC voltage provided from across the two series-connected energy-storing capacitors C1 and C2.

Or, stated differently, in the circuit of FIG. 1, if the inverter's AC output voltage as provided between terminals Oa and Ob were to be rectified in a full-wave rectifier, the average magnitude of the DC voltage obtained from this full-wave rectifier would have to be substantially equal to the magnitude of the DC voltage supplied from the DC output of the rectifier/filter combination consisting of R1, R2, C1 and C2.

This relationship would have to exist substantially regardless of the nature of the load connected between the inverter's output terminals.

(i) Although the full-bridge inverter circuit of FIG. 1 may be designed to invert at any one of a wide range of frequencies, in the preferred embodiment the inversion frequency is approximately 30 kHz. Thus, the time-length of the interval between point X and point Y of FIG. 2a is about 33 micro-seconds.

Figure 2:
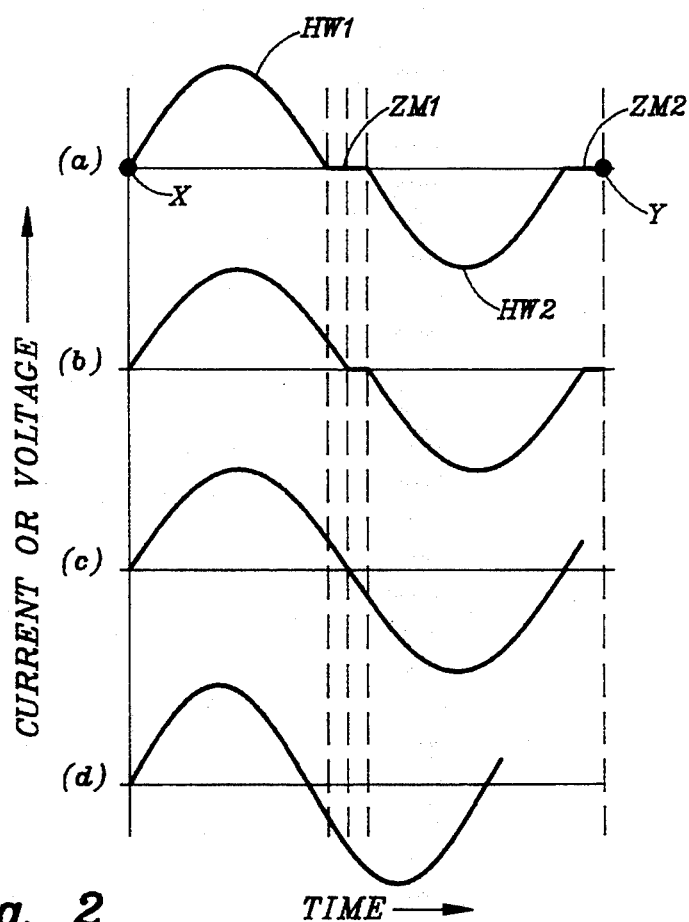
FIG. 2 shows various voltage waveforms associated with the embodiment of FIG. 1.

(j) The waveforms of FIG. 2 depict the voltage present between output terminals Oa and Ob under different operating conditions. Of course, the voltage present between Oa and inverter reference terminal IRT is equal to half the voltage present between terminals Oa and Ob.

(k) Due to the balanced nature of the inverter and its DC power supply, with reference to any one of the terminals of filter capacitors C1 and C2, any high frequency voltage present at inverter reference terminal IRT—even if it were not connected with ground—would have negligible magnitude.

(l) The primary windings of saturable current transformers SCT1 and SCT2 have fewer turns than do the secondary windings. Typically, the transistors operate with a 1:4 primary-to-secondary turns ratio; which corresponds to a forced current gain of four. At that turns ratio, the magnitude of the voltage developing across the primary winding of each of the saturable current transformers is only one fourth of the magnitude of the base-emitter voltage; which, of course, is only about 0.8 Volt.

In other words, the magnitude of the voltage developing across the primary winding of each staturable transformer is only about 0.2 Volt; which, of course, represents a magnitude that is totally negligible in comparisn with the magnitude of the voltage developing between output terminals Oa and Ob.

Thus, the voltage at terminal Ob is substantially equal to the voltage at terminal Jb; and the voltage at terminal Oa is substantially equal to the voltage at terminal Ja.

DESCRIPTION OF THE SECOND EMBODIMENT

Details of Construction of Second Embodiment

Figures 3B, 4:
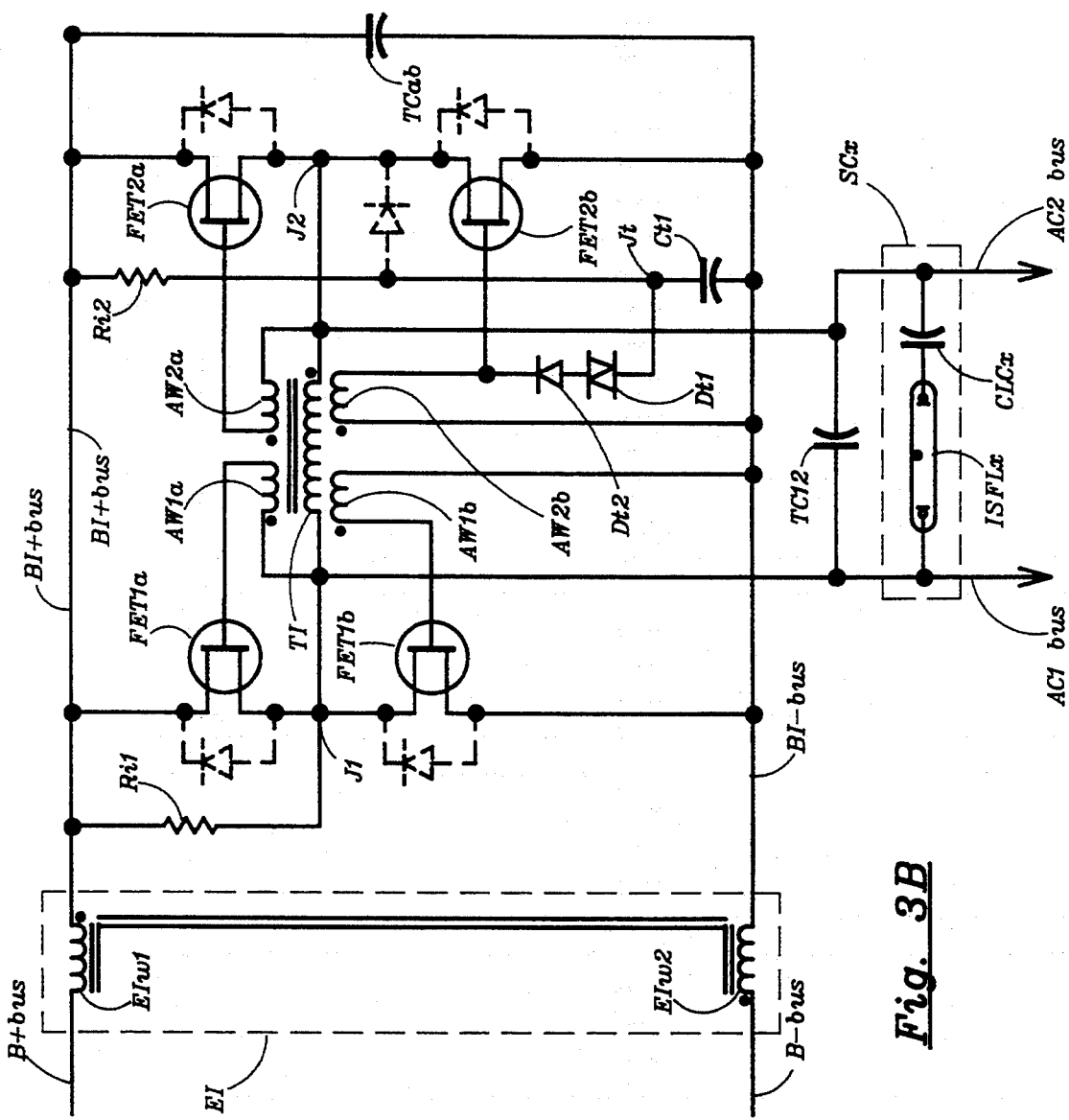
Figure 4A:
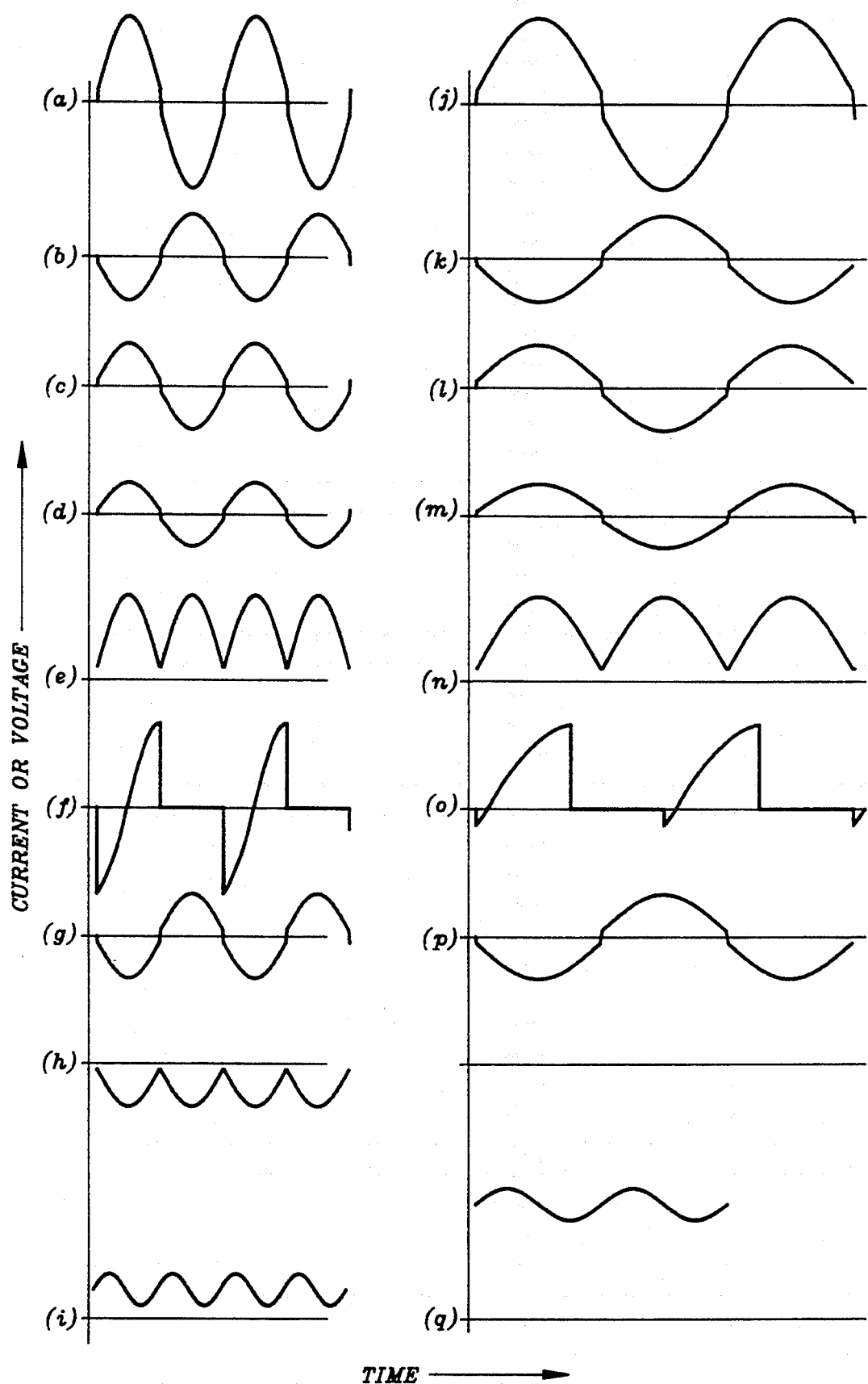

FIG. 3, which consists of FIGS. 3A and 3B, which should be viewed together is a schematic diagram of the second embodiment of the invention.

In FIG. 3, an ordinary electric utility power line is represented by a source S, whose source terminals ST1 and ST2 are connected with a pair of power input terminals PIT1 and PIT2 of a bridge rectifier BR; which bridge rectifier BR has two DC output terminals DC− and DC+. A high-frequency filtering capacitor HFFC is connected between the DC− terminal and the DC+ terminal.

A first winding Le1 of energy-storing inductor Le is connected between the DC+ terminal and a DC+ bus; which DC+ bus is connected with a B+ bus by way of a high-speed rectifier HSR1. A second winding Le2 of energy-storing inductor Le is connected between the DC− terminal and a DC− bus; which DC− bus is connected directly with a B− bus. 1B− bus. Windings Le1 and Le2 are two mutually coupled windings wound on a single magnetic structure.

A pre-converter PCIC is an integrated circuit (Motorola MC 34262) and has eight terminals 1–8. Terminal 8 is connected with an A+ bus; which A+ bus is also connected with the cathode of a diode Dp1, whose anode is connected with a tap T on winding Le2. A resistor Rp1 is connected between tap T and terminal 5 of PCIC. A filter capacitor FCp1 is connected between the A+ bus and the DC− bus; and a filter capacitor FCp2 is connected between the B− bus and the B+ bus.

A resistor Rn2 is connected between the DC+ bus and a terminal 3 of the PCIC; while a resistor Rn3 and a capacitor Cp2 are parallel-connected between terminal 3 and the DC− bus.

A capacitor Cp3 is connected between terminal 2 of the PCIC and the A+ bus; while terminal 6 is connected with the DC− bus. A resistor Rp4 is connected between the B+ bus and terminal 1; and a resistor Rp4 is connected between terminal 1 and the B— bus. Terminal 4 is connected with the DC— bus via a resistor Rp6.

A field effect transistor FETp is connected: (i) with its source terminal to terminal 4 of the PCIC, (ii) with its drain terminal to the DC+ bus, and (iii) with its gate terminal to terminal 7 of the PCIC.

The B+ bus is connected with a BI+ bus via a first winding EIw1 of an energy-storing inductor EI; while the B— bus is connected with a BI— bus via a second winding EIw2 of energy-storing inductor EI. Windings EIw1 and EIw2 are two mutually coupled windings on a single magnetic structure.

Each of field effect transistors FET1a and FET2a is connected with its drain terminal to the BI+ bus; and each of field effect transistors FET1b and FET2b is connected with its source terminal to the BI— bus. The source terminals of transistors FET1a and FET1b are connected with junctions J1 and J2, respectively; as are also the drain terminals of transistors FET1b and FET2b, as well as an AC1 bus and an AC2 bus, all respectively.

A tank inductor TI is connected between junction J1 and J2; which tank inductor has four auxiliary windings coupled thereto: AW1a, AW1b, AW2a, and AW2b; which windings are connected between the gate and source terminals of transistors FET1a, FET1b, FET2a, and FET2b, all respectively.

A first tank capacitor TCab is connected between the BI— bus and the BI+ bus; while a second tank capacitor TC12 is connected between junctions J1 and J2 (i.e., between the AC1 bus and the AC2 bus). A series-combination SC of a first current-limiting capacitor CLCx and a first instant-start fluorescent lamp ISFLx is connected between the AC1 bus and the AC2 bus.

A resistor Rt1 is connected between the BI+ bus and a junction Jt; a capacitor Ct1 is connected between junction Jt and the BI— bus; and a Diac Dt1 is connected between junction Jt and the anode of a diode Dt2, whose cathode is connected with the gate terminal of transistor FET2b.

Details of Operation of Second Embodiment

The operation of the second embodiment of FIG. 3 may best be understood by making reference to the voltage and current waveforms of FIG. 4; wherein:

Waveform (a) represents the high-frequency voltage existing between the AC1 bus and the AC2 bus under a condition of no load (i.e., with fluorescent lamp ISFLx removed);

Waveform (b) represents the high-frequency voltage existing between Earth Ground and the AC1 bus under no-load condition;

Waveform (c) represents the high-frequency voltage existing between Earth Ground and the AC2 bus under no-load condition;

Waveform (d) represents the voltage existing between the BI— bus and the gate of transistor FET1b (i.e., the gate-source drive voltage of transistor FET1b) under no-load condition;

Waveform (e) represents the voltage existing between the BI— bus and the BI+ bus under no-load condition;

Waveform (f) represents the current flowing through transistor FET1b under no-load condition;

Waveform (g) represents the AC voltage existing between the B— bus (or the B+ bus) and junction J1 (or J2) under a condition of no load; which is to say: disregarding any DC voltage component, waveform (d) represents the actual voltage existing between the B— bus (or the B+ bus) and junction J1 (or J2) under no-load condition;

Waveform (h) represents the voltage existing between the B— bus and the BI— bus under no-load condition;

Waveform (i) represents the current flowing between the B— bus and the BI— bus (or: between the BI+ bus and the B+ bus) under no-load condition;

Waveform (j) represents the high-frequency voltage existing between the AC1 bus and the AC2 bus under a condition of part load (i.e., with fluorescent lamp ISFLx connected and functioning);

Waveform (k) represents the high-frequency voltage existing between Earth Ground and the AC1 bus under part-load condition;

Waveform (l) represents the high-frequency voltage existing between Earth Ground and the AC2 bus under part-load condition;

Waveform (m) represents the voltage existing between the BI— bus and the gate of transistor FET1b (i.e., the gate-source drive voltage of transistor FET1b) under part-load condition;

Waveform (n) represents the voltage existing between the BI— bus and the BI+ bus under part-load condition Waveform (o) represents the current flowing through transistor FET1b under part-load condition;

Waveform (p) represents the AC voltage existing between the B— bus (or the B+ bus) and junction J1 (or J2) under part-load condition; which is to say: disregarding any DC voltage component, waveform (p) represents the actual voltage existing between the B— bus (or the B+ bus) and junction J1 (or J2) under part-load condition;

Waveform (q) represents the current flowing between the B— bus and the BI— bus (or: between the BI+ bus and the B+ bus) under part-load condition;

Waveform (r) represents the full-wave-rectified power line voltage existing between the DC— terminal and the DC+ terminal under part-load condition;

Waveform (s) represents the voltage existing between the DC+ terminal and the DC+ bus under part-load condition;

Waveform (t) represents the voltage existing between the DC— terminal and the DC— bus under part-load condition;

With reference to the waveforms of FIG. 4, the operation of the embodiment of FIG. 3 may now be described as follows.

As illustrated by waveform (r), full-wave rectification of the AC power line voltage from source S results in a pulsating (i.e., unfiltered) unidirectional voltage existing between the DC— terminal and the DC+ terminal. This unfiltered unidirectional voltage is supplied to a pre-converter circuit; which, except for using a split winding on its energy-storing inductor L, functions in a substantially ordinary manner, thereby to provide a filtered and regulated DC supply voltage between the B— bus and the B+ bus. {The complete assembly between the power line input terminals (PIT1, PIT2) and the DC supply voltage output terminals (i.e., the B— bus and the B+ bus) is referred-to as the Pre-Converter Circuit.}

The fact that energy-storing inductor L has two windings provides for two auxiliary benefits.

One auxiliary benefit is that of causing less electromagnetic interference (EMI) to be conducted from the Pre-Converter Circuit to the power line conductors; which benefit results for the reason that—just like any ordinary two-winding EMI choke—the split-winding energy-storing inductor L provides both common-mode and differential-mode attentuation of the EMI signals (unintentionally) generated in the Pre-Converter Circuit (and/or in the Bridge Inverter Circuit).

The other auxiliary benefit is that of maintaining symmetry of voltages and currents with respect to each of the power line supply terminals (ST1, ST2) (as well as with respect to earth ground); which symmetry facilitates the provision of a balanced AC output voltage from the AC output terminals of the Bridge Inverter Circuit (i.e., the AC1 bus and the AC2 bus).

As a consequence of the split-winding feature, the voltage existing between the DC+ terminal and the DC+ bus will be as shown by waveform (s), and the voltage existing between the DC-terminal and the DC— bus will be as shown by waveform (t). The sum of these two voltages would be equal to the voltage that would exist across the winding of an ordinary single-winding energy-storing inductor as used in an ordinary pre-converter circuit.

The filtered and regulated DC supply voltage from the Pre-Converter Circuit (which exists between the B— bus and the B+ bus) is provided to the Bridge Inverter Circuit, where it is applied between the BI+ bus and the BI— bus by way of windings EIw2 and EIw2, respectively.

Windings EIw1 and EIw2 are wound on a single magnetic structure (e.g., ferrite core) in a mutually coupled manner. Thus, they constitute a single energy-storing inductive entity; and, except for voltage and current symmetry considerations, the two windings could just as well have been combined into a single winding.

With the DC supply voltage applied between the BI— bus and the BI+ bus, the Bridge Inverter Circuit is triggered into self-oscillation, with the triggering being effected by elements Ri1, Ri2, Ct1, Dt1 and Dt2.

After triggering, the basic bridge inverter per se (i.e., the circuit assembly consisting of principal elements FET1a, FET1b, FET2a, FET2b, and TI) will self-oscillate by way of the positive feedback provided via the auxiliary windings on tank-inductor TI (i.e., auxiliary windings AW1a, AW1b, AW2a and AW2b).

Although the average magnitude of the DC voltage present between the BI— bus and the BI+ bus must be equal to that of the DC supply voltage (as provided between the B— bus and the B+ bus), the instantaneous magnitude of this DC voltage will vary in synchronism with the oscillations of the bridge inverter.

The effect of tank-capacitors TCa and TC12 is that of making the waveform of the alternating voltage provided between the bridge inverter's output terminals (i.e., J1 and J2) sinusoidal, with the frequency of oscillation being determined by the resonant interaction between these tank-capacitors and tank-inductor TI.

With the fluorescent lamp (ISFLx) non-connected (i.e., when supplying no output power), some of the voltage and current waveforms associated with the self-oscillating Bridge Inverter Circuit are as shown by waveforms (a) through (i) of FIG. 4.

In particular, it is noted that the high-frequency voltage existing between Earth Ground and the AC1 bus is equal in magnitude but opposite in phase as compared with the high-frequency voltage existing between Earth Ground and the AC2 bus.

Also, it is noted that the alternating voltage existing between the B— bus and junction J1 is equal to the high-frequency voltage existing between Earth Ground and the AC1 bus. Of course, the alternating voltage existing between the B+ bus and junction J1 is substantially identical to the alternating voltage existing between the B— bus and junction J1.

Since the voltage existing between the AC1 bus and the AC2 bus is sinusoidal {see waveforms (a) and (j)}, and since this sinusoidal voltage is the same as that existing across tank-inductor TI, the waveform of each of the gate-source drive voltages provided from auxiliary windings AW1a, AW1b, AW2a and AW2b will also be sinusoidal {see waveforms (d) and (m)}.

While it is unusual in a power-handling inverter to operate FET's with a sinusoidal gate-source drive voltage (as opposed to the usual squarewave gate-source drive voltage), such may indeed be done without incurring excessive power losses while at the same time averting damage to the FET's.

To minimize switching power losses, it is necessary that the peak magnitude of the sinusoidal gate-source drive voltage be significantly higher than the magnitude merely required to cause the FET to fully enter its ON-state; which means that the peak magnitude of a sinusoidal gate-source drive voltage must be significantly higher than the peak magnitude of a squarewave gate-source drive voltage (which is what is conventionally used for driving FET's in a power-handling inverter). In particular, in the Bridge Inverter Circuit of FIG. 3, the peak magnitude of the sinusoidal drive voltage provided to the gate-source inputs of each of the FET's is about 40 Volt; which is higher by a factor of four at compared with the peak magnitude required when a squarewave gate-source drive voltage is used.

While a peak voltage of 40 Volt is higher than the peak gate-source voltage normally considered permissible for power FET's, is indeed acceptable (i.e., without incurring damaging effects) with certain types of FET's, such as FET's of type IRF 721 from International Rectifier Corporation, El Segundo, Calif. With a sinusoidal drive voltage of 40 Volt peak magnitude, total power dissipation in the FET's in the Bridge Inverter Circuit was indeed acceptably low.

With the fluorescent lamp (ISFLx) connected (i.e., when supplying a moderate amount of output power), some of the voltage and current waveforms associated with the self-oscillating Bridge Inverter Circuit of FIG. 3 are as shown by waveforms (j) through (q) of FIG. 4.

It is noted that the frequency of the all the waveforms associated with the partially loaded condition is substantially lower than that of the no-load condition. This is so for the reason that, when the lamp is connected and operating, the voltage across it is very small (only about 150 Volt RMS) compared with the magnitude of the voltage present across the lamp-capacitor series-combination (about 500 Volt RMS); which means that this series-combination constitutes substantial additional capacitive loading on the inverter's basic tank-circuit (i.e., tank-inductor TI as combined with tank-capacitors TCa and TC12), thereby reducing the natural resonance frequency.

Additional Comments re Second Embodiment (aa) In some situations, to provide for affirmative triggering of the Bridge Inverter Circuit of FIG. 3, a resistor may be connected between the BI+ bus and junction J1.

(ab) In most situations, tank-capacitor TC12 may safely be eliminated; in which case tank-capacitor TCa should be increased in capacitance sufficiently to compensate for any undesirable increase in (no-load) oscillating frequency due to the removal of TC12.

(ac) As is the case with any ordinary electric utility power line, the power line conductors are electrically connected with earth ground, either directly or by way of a low-resistance path. In case of the circuit arrangement of FIG. 3, this connection is indicated by one of the power line conductors having electrical connection with Earth Ground.

(ad) With reference to waveform (a) of FIG. 4, as well as with reference to waveform (d), it is noted that the waveform of the inverter output voltage under no-load condition is sinusoidal except for a small portion of the total wave cycle. More particularly, during a very brief period at or near each cross-over point of the voltage wave, instead of having the usual slope associated with a sinusoidal wave, the wave has a notably steeper slope.

This slope-steepening is due to the fact that, during this very brief period, none of the four transistors is fully in its ON-state; which means that tank-capacitor TCa is, during this very brief period, at least partly disconnected from tank-inductor TI; which, in turn, causes the voltage across tank-conductor TI to rise at a higher rate; which higher rate is now limited by tank-capacitor TC12 only, as opposed to being limited by both tank-capacitors TC12 and TCa.

Of course, the slope-steepening effect on the waveform of the inverter's output voltage is directly reflected in the waveform of the gate-source drive voltage of each FET.

As indicated by waveforms (j) and (m), the slope-steepening effect is less pronounced under loaded conditions.

(ae) Since the fluorescent lamp (ISFLx) is ballasted by way of a capacitor, the slope-steepening effect referred-to in section (ad) above has the effect of causing an added spike or pulse in the instantaneous magnitude of the current provided to the fluorescent lamp; which spike or pulse occurs at or near each absolute-magnitude-peak of the otherwise substantially sinusoidal lamp current.

(af) With reference to FIG. 3, it should be understood that additional lamp-capacitor series-combinations may be connected between the AC1 bus and the AC2 bus (i.e., across the AC rails). However, the more such series-combinations so connected, the lower will be the frequency of oscillation of the inverter and thus the lower will be the frequency of the AC voltage provided between the AC1 bus and the AC2 bus; which correspondingly results in a lower magnitude of the current delivered through the series capacitors (i.e., the ballasting capacitors) to each lamp.

(ag) It is emphasized that waveforms (b), (c), (k) and (l) of FIG. 4 represent the waveforms of the high-frequency componets of the actual voltages existing between Earth Ground and the AC1/AC2 buses under no-load and part-load condittions. However, it is important to realize that the waveforms of these actual voltages also include low-frequency components; which low-frequency components are not shown in the waveforms of FIG. 4.

In situations where the presence of such low-frequency components are found to be of concern with respect to passing the U.L. shock-hazard safety requirements (e.g., the so-called U.L Pin Test), it is noted that a high-pass filter (e.g., in the form a low-frequency blocking capacitor in series-connection with each of the AC1/AC2 buses) will mitigate such shock-hazard possibilites.

DESCRIPTION OF AN ALTERNATIVE SECOND EMBODIMENT

Details of Construction of Alternative Second Embodiment

FIG. 5, which consists of FIGS. 5A and 5B, which should be viewed together, is a schematic diagram of an alternative second embodiment of the present invention.

The arrangement of FIG. 5 is identical to that of FIG. 3 except for the following modifications.

Tank capacitor TC12 has been removed.

Elements Ri1, Ri2, Ct1, Dt1 and Dt2 have been removed.

A resistor R1a is connected between the drain terminal and the gate terminal of transistor FET1a; a resistor R2b is connected between the drain terminal and the gate terminal of transistor FET2b.

Zener diodes Z1a, Z1b, Z2a, Z2b are interposed between windings AW1a, AW1b, AW2a, AW2b and the gate terminals of transistors FET1a, FET1b, FET2a, FET2b, all respectively and in each case with the cathode of the Zener diode being connected with its associated gate terminal.

Winding SIw2 of inductor EI has been relocated such as to be connected directly in series with winding EIw1, thereby having both these windings series-connected between the B+ bus and the BI+ bus, thereby also leaving the B− bus connected directly with the BI− bus. The mid-point of the series-combined windings EIw1 and EIw2 is identified as center-tap EIct.

A resistor Rc1 has been inserted in series with the AC1 bus in such manner that whatever current flows from the AC1 bus must flow through resistor Rc1. Parallel-connected with resistor Rc1 is the primary winding CTp of a control transformer CT, whose secondary winding CTs is connected between the B− bus and the cathode of a diode Dc1, whose anode is connected with the B− bus by way of a capacitor Cc1.

An auxiliary winding AWc on tank inductor TI is connected with one of its terminals to the B− bus; the other one of its terminals being connected with the drain terminal of a field effect transistor FETc through a tank-capacitor TCc.

The source terminal of transistor FETc is connected with the B− bus; and the gate terminal of transistor FETc is connected with output terminal OTc2 of inverter Ic2 of a HEX Inverter HEXI. Input terminal ITc2 of inverter Ic2 is connected with output terminal OTc1 of inverter Ic1 of HEX inverter HEXI. Input terminal ITc1 of inverter Ic1 is connected with output terminal OTc2 of inverter Ic2 by way of a feedback capacitor Cc2.

A resistor 2 is connected between output terminal OTc1 and the cathode of a diode Dc2; a resistor Rc3 is connected between the A+ bus and input terminal ITc1 of inverter Ic1; while a resistor Rc4 is connected between input terminal ITc1 of inverter Ic1 and the anode of diode Dc1.

Details of Operation of Alternative Second Embodiment

The operation of the alternative second embodiment of FIG. 5—to the extent that it differs from the operation of the second embodiment of FIG. 3—may best be understood by making reference to the voltage and/or current waveforms of FIG. 6; wherein:

Waveform (aa) represents the high-frequency voltage existing between the AC1 bus and the AC2 bus under a condition of less-than-full load (i.e., with fewer than all intended lamp-capacitor series-combinations—one of which would be SCx—connected between the AC1-/AC2 buses).

Waveform (ab) represents the high-frequency current flowing through lamp ISFLx under the condition of less-than-full load.

Waveform (ac) represents the high-frequency voltage existing between the AC1 bus and the AC2 bus under a condition of full load (i.e., with all intended lamp-capacitor series-combinations connected between the AC1/AC2 buses).

Waveform (ad) represents the high-frequency current flowing through lamp ISFLx under the condition of full load.

Waveform (ae) represents the voltage present between the BI− bus and the drain terminal of transistor FET1$b$ under a condition of less-than-full load.

Waveform (af) represents the voltage present between the BI− bus and the drain terminal of transistor FET1$b$ under a condition of full load.

Now, with reference to the waveforms of FIGS. 4 and 6, the operation of the embodiment of FIG. 5 may be described as follows.

The Zener voltage of each of the Zener diodes (Z1$a$, Z1$b$, Z2$a$, Z2$b$) has been chosen such as to be slightly higher in magnitude than that of the gate voltage at which each of the transistors (FET1$a$, FET1$b$, FET2$a$, FET2$b$) starts conducting current between its source and drain. As a result, each transistor switches OFF a brief period later than it would have switched OFF without the Zener diodes; which, as compared with the arrangement of FIG. 3, leads to a reduction in the duration of the short period of time during which none of the transistors conduct.

As a bottom-line result—comparing exemplary waveform (a) of FIG. 4 with exemplary waveform (aa) of FIG. 6—the degree of slope-steepening at the crossover points of the inverter's otherwise sinusoidal output voltage has been minimized; which, in turn, leads to a lamp current with better crest-factor as compared with the lamp current crest-factor associated with the arrangement of FIG. 3.

Also as a result of the Zener diodes, the bridge inverter can be biased (e.g., with resistors R1$a$ and R2$b$) so as to cause two of the transistors to conduct, thereby to cause the inverter to self-start and thereby to eliminate the need for the Diac-type trigger circuit of FIG. 3.

Now, with particular reference to FIG. 5 (the part showing the Bridge Inverter Circuit) and waveforms (aa) & (ab) versus waveforms (ac) & (ad) of FIG. 6, prior to the fluorescent lamps having ignited, transistor FETc exists in its ON-state; which is to say that it exists in its fully conductive state. This is so because no current flows through resistor Rc1; which means that no negative voltage is present at the anode of diode Dc1; which means that input terminal ITc1 of inverter Ic1 will (via resistor Rc3) be pulled to a potential sufficiently positive to cause the two series-connected inverters IC1 and IC2 (via regenerative action resulting from the positive feedback supplied via capacitor Cc2) to enter a state whereby output terminal OTc2 goes positive all the way to the level of the A+ bus, thereby causing transistor FETc to enter its ON-state. Thereafter, until the lamps ignite, input terminal ITc1 remains positive to a degree sufficient to maintain output terminal OTc2 positive.

With transistor FETc in its ON-state, tank capacitor TCc is in effect connected in parallel with tank-capacitors TCa and TC12, thereby causing the natural oscillating frequency of the bridge inverter to be lower by a substantial factor compared with what it would be with transistor FETc in its OFF-state.

As soon as the lamps ignite, current will flow through resistor Rc1; which will give rise to a negative voltage developing at the anode of diode Dc1; which, if that negative voltage be of sufficient magnitude, will cause the magnitude of the voltage present at input terminal ITc1 to decrease in magnitude sufficiently to cause the two series-connected inverters IC1 and IC2 (again via regenerative action) to cause the magnitude of the voltage at output terminal OTc2 to fall to a level sufficiently low to render transistor FETc non-conductive.

In fact, when all lamps are connected and in operation, the magnitude of the negative voltage developed at the anode of diode Dc1 is just sufficient to cause the two series-connected inverters (Ic1, IC2) to regenerate, thereby to cause transistor FETc to enter its OFF-state, thereby to remove tank-capacitor TCc from the tank-inductor, thereby to cause the frequency of the inverter's AC output voltage (i.e., the AC voltage provided between the AC1 bus and the AC2 bus) to increase substantially; which, if the magnitude of this AC output voltage were to have remained the same, would have cuased the magnitude of the lamp current to increase in proportion to the increase in frequency.

However, by action of diode Dc2 and resistor Rc2, the magnitude of the DC supply voltage will decrease simultaneously with the increase in frequency of the inverter's AC output voltage. This is so because output terminal OTc1 assumes a potential obverse to that of output terminal OTc2; which means that: (i) whenever transistor FETc is in its ON-state, output terminal OTc1 is at a potential close to that of the B− bus; which means that resistor Rc2 is in effect parallel-connected with resistor Rp5; which therefore causes the magnitude of the DC supply voltage to be regulated to a level substantially higher than the level to which it would be regulated without resistor Rc2 being so parallel-connected; and (ii) whenever transistor FETc is in its OFF-state, output terminal OTc1 is at a potential close to that of the A+ bus; which means that resistor Rc2 is now not parallel-connected with resistor Rp5; which means that the magnitude of the DC supply voltage be regulated at a level substantially lower than the level to which it be regulated when transistor FETc is in its ON-state.

Thus, as illustrated by the waveforms of FIG. 6: (i) whenever less than full load current is being drawn from the AC1 bus, the AC output voltage (i.e., the AC voltage provided between the AC1 bus and the AC2 bus) will have a relatively high RMS magnitude and a relatively low frequency; and (ii) whenever full load current is being drawn from the AC1 bus, the AC output voltage will have a relatively low RMS magnitude and a relatively high frequency.

Thus, if one or more lamps were to be removed during normal operation—such as would occur during an ordinary re-lamping procedure—the AC output voltage would increase in RMS magnitude but would decrease in frequency, thereby keeping the remaining lamp(s) properly powered. Yet, upon replacing all lamps (thereby re-establishing full load), the AC voltage would decrease in RMS magnitude while at the same time increasing in frequency.

An important reason for reducing the RMS magnitude of the AC output voltage when the ballast is operating at full power level is that of efficiency. For given sizes and/or ratings of components, the pre-converter (as well as the inverter) operates at higher efficiency when the magnitude of the DC supply voltage is lower. More particularly, the efficiency of the pre-converter increases with a reduction in the ratio between the absolute magnitude of the DC supply voltage and the peak absolute magnitude of the AC power line voltage.

For instance, with a given set of component parts, delivering 60 Watt of DC power at a DC rail voltage of about 350 Volt requires about 1.0 Watt more from a 120Volt/60 Hz power line than delivering the same amount of DC power at a DC rail voltage of only 230 Volt.

Additional Comments re Alternative Second Embodiment (aa) The reason associated with removing tank-capacitor TC12 from the embodiment of FIG. 5 relates to two things:
1. The removal of tank-capacitor TC12 (even if the capacitance of tank-capacitor TCa were to be increased to provide for compensation in oscillating frequency) simply represents an economic advantage; and
2. The removal of tank-capacitor TC12 permits easier triggering of the inverter, thereby (in cases where the inverter circuit is provided with its DC supply voltage from a more-or-less ordinary pre-converter, such as is indeed the case in the embodiment of FIG. 5) permitting the removal of the trigger circuit consisting of elements Rt1, Ct1, Dt1 and Dt2 in exchange for a simpler trigger means connected in circuit between the pre-converter circuit and the gate-source terminals of transistor FET1b (or transistor FET2b), thereby taking advantage of the start of oscillations of transistor FETp to trigger the inverter circuit into self-oscillation.

For instance, triggering of the inverter circuit could be accomplished by way of an auxiliary winding on energy-storing inductor Le; which auxiliary winding would be coupled between the gate-source terminals of transistor FET1b by way of a resistor.

(ab) The frequency of operation of the inverter circuit of FIG. 3 is about 22 kHz when fully loaded. Yet, improved efficiency and/or reduced inductor sizes would result if it were possible to operate at higher frequencies when fully loaded. However, due to certain optical and/or electrical interference problems associated with certain commonly used in-building electronic control and communications systems (including particularly TV remote controls), it is important not to have electronic ballasts operate in the frequency range between 34 and 40 kHz (hereinafter the "forbidden frequency band").

In the embodiment of FIG. 5, due to the removal of tank-capacitor TC12, the frequency of operation of the inverter circuit is well in excess of 40 kHz when unloaded or partly loaded; yet, at about 32 kHz, it is safely under 34 kHz when fully loaded.

With a loaded operating frequency of 32 kHz, energy-storing inductor EI and tank-inductor TI can be substantially smaller and lighter-of-weight as compared with what would otherwise be required to attain a given efficiency level. Or, conversely, at given sizes and weights for the inductor elements, the operating efficiency would be substantially improved.

More particularly, the embodiment of FIG. 5 is characterized by operating above the forbidden frequency band during no-load and/or part-load conditions, while operating below the forbidden frequency band during fully loaded conditions.

In this connection, it is observed that presently available electronic ballasts of the so-called parallel-resonant type operate at frequencies of about 22 kHz when fully loaded.

(ac) It should be understood than many of the advantages associated with the full-bridge inverter circuit embodiments of FIGS. 3 and 5 may be attained as well with half-bridge and/or so-called parallel push-pull embodiments.

(ad) In ordinary electronic ballasts of the half-bridge parallel-resonant type—such as sold by Electronic Ballast Technology (EBT), Inc. of Torrance, Calif.—the peak magnitude of the voltage existing across each of the two inverter transistors is higher than (or at least as high as) half of the magnitude of the inverter's DC supply voltage multiplied by pi (i.e., 3.14). Thus, with a DC supply voltage of (say) 200 Volt, the peak magnitude of the voltage across one of the inverter transistors would usually be higher than (but would be at least as high as) 314 Volt.

In electronic ballasts of the push-pull parallel-resonant type—such as sold by Triad-Utrad (a unit of MagneTek, Inc. of Los Angeles, Calif.)—the peak magnitude of the voltage existing across each of the two inverter transistors is normally higher than (but is at least as high as) the magnitude of the inverter's DC supply voltage multiplied by pi (i.e., 3.14). Thus, with a DC supply voltage of (say) 200 Volt, the peak magnitude of the voltage across one of the inverter transistors would be at least 628 Volt.

In an electronic ballast built in accordance with the circuit arrangement of FIG. 1 herein, and as long as operating with the waveforms marked (a), (b) or (c) of FIG. 2 herein, the peak magnitude of the voltage across each one of the four inverter transistors will be higher than (or at least as high as) half of the magnitude of the inverter's DC supply voltage multiplied by pi (i.e., 3.14). Thus, with a DC supply voltage of (say) 200 Volt, the peak magnitude of the voltage across one of the inverter transistors in the circuit of FIG. 1—when operating with waveforms (a)-(c)—would be at least 314 Volt.

In an electronic ballast built in accordance with the circuit arrangement of FIG. 1 herein, and as long as operating with the waveform marked (d) of FIG. 2 herein, the peak magnitude of the voltage across each one of the four inverter transistors will be lower than half of the magnitude of the inverter's DC supply voltage multiplied by pi (i.e., 3.14). Thus, with a DC supply voltage of (say) 200 Volt, the peak magnitude of the voltage across one of the inverter transistors in the circuit of FIG. 1—when operating with waveform (d)—would be less than 314 Volt.

In an electronic ballast built in accordance with the circuit arrangement of FIGS. 3 or 5 herein, the peak magnitude of the voltage across each one of the four inverter transistors will be lower than half of the magnitude of the inverter's DC supply voltage multiplied by pi (i.e., 3.14). Thus, with a DC supply voltage of (say) 200 Volt, the peak magnitude of the voltage across one of the inverter transistors in the circuit of FIG. 3 (or FIG. 5) would be less than 314 Volt.

In an electronic ballast built in accordance with the principles of the circuit arrangements of FIGS. 3 or 5 herein—even if using a half-bridge configuration instead of the illustrated full-bridge configuration—the peak magnitude of the voltage across each one of the two half-bridge inverter transistors would be lower than half of the magnitude of the inverter's DC supply voltage multiplied by pi (i.e., 3.14). Thus, with a DC supply voltage of (say) 200 Volt, the peak magnitude of the voltage across one of the two half-bridge inverter transistors would then be less than 314 Volt.

In an electronic ballast built in accordance with the principles of the circuit arrangements of FIGS. 3 or 5 herein—even if using a push-pull configuration instead of the illustrated full-bridge configuration—the peak magnitude of the voltage across each one of the two push-pull inverter transistors would be lower than the magnitude of the inverter's DC supply voltage multiplied by pi (i.e., 3.14). Thus, with a DC supply voltage of (say) 200 Volt, the peak magnitude of the voltage across one of the two push-pull inverter transistors would then be less than 628 Volt.

(ae) The reason why—for a given circuit topography and a given magnitude of DC supply voltage—the peak magnitude of the voltage existing across each transistor in the inverters of ordinary parallel-resonant-type electronic ballasts is higher than the peak magnitude of the voltage existing across each transistor in the inverter of an electronic ballast based on the parallel-resonant principles of the embodiments of FIGS. 3 and 5 herein is a result of the following basic difference: in the inverters of ordinary parallel-resonant electronic ballasts, no provision has been provided whereby—at least for a very brief period—none of the inverter's switching transistors is permitted to exists in its switched-ON or conductive state.

That is, in ordinary parallel-resonant electronic ballasts, usual practice is for one transistor to be switched OFF only after its obverse transistor has been switched ON {thereby having a situation where—for a brief period each half-cycle—both of two obverse (i.e., alternatingly switched) transistors are ON at the same time}; whereas, in the inverter circuit of FIGS. 3 and 5, provisions are made whereby one of the transistor is indeed switched OFF a short period before its obverse transistor has been switched ON, thereby providing for a situation where—at least for a very brief period of time—not one of a pair of obverse transistors (e.g., FET1b and FET2a) exists in a state of being switched ON.

(af) With reference to FIGS. 3 and 5, in some cases it may be non-feasible to provide between inverter output terminals J1 and J2 an AC voltage of the exact RMS magnitude required to exist between the AC1 bus and the AC2 bus for proper lamp ignition and operation. In such cases, an auto-transformer approach may be used to increase or decrease the RMS magnitude of the AC voltage provided between the AC1/AC2 buses. That is, tank-inductor TI may be integrally combined with an auto-transformer without having to add a separate transformer means.

(ag) In the bridge inverter circuits of FIGS. 3 and 5, the drive voltage provided between the gate-source terminals of each of transistors FET1a, FET1b, FET2a and FET2b—see waveform (d) of FIG. 4—is of substantially sinusoidal waveform and of a peak magnitude substantially higher than what's just required to cause each transistor to enter its fully conductive state.

Typically, the magnitude of the gate-source voltage required for causing a field effect transistor (such as FET1a, FET1b, FET2a and FET2b) to enter is full-conduction state (i.e., its full-ON state) is no higher than about 10 Volt; which means that if a squarewave-shaped drive voltage had been used for driving these FET's, its peak magnitude would not have had to be higher than about 10 Volt. However, since the FET's in the bridge inverter circuit arrangements of FIGS. 3 and 5 are provided with a substantially sinusoidally-shaped drive voltage, it is clear that the peak magnitude of this drive voltage has to be higher than 10 Volt.

In different implementations of the circuits of FIG. 3, sinusoidally-shaped base-source drive voltages of peak magnitudes from as low as 20 Volt to as high as 40 Volt have been successfully used. Except for possible long term detrimental consequences with respect to FET operating life, the higher peak magnitudes are preferable because of correspondingly (though not proportionally) better switching efficiency and correspondingly (though not proportionally) lower lamp current crest factor.

With respect to the arrangement of FIG. 3, and with further reference to waveform (ab) of FIG. 6, the magnitude of the bumps or pulses present at or near the peaks of each wave-crest of the lamp current diminishes with increased magnitude of gate-source drive voltage, thereby correspondingly resulting in an improved (i.e., reduced) lamp current crest factor.

Also with reference to FIG. 3 and waveform (ab) of FIG. 6, another way of reducing the magnitude of the bumps or pulses present at or near the peaks of each wave-crest of the lamp current—thereby to improve the crest-factor (though not necessarily the switching efficiency)—is that of placing a resistor in series with the input to each gate of each FET.

(ah) To facilitate triggering of the bridge inverter of FIG. 3, a resistor Ri1 is connected between the BI+ bus and junction J1.

(ai) With reference to FIG. 3, to stop continued triggering action after the inverter has attained self-sustaining oscillation, the anode of a diode may be connected with junction Jt and the cathode of the same diode may be connected with the drain terminal of transistor FET2b.

(aj) With reference to FIG. 5, so as to cause only a small drop in the magnitude of the current flowing through resistor Rc1 to cause transistor FETc to enter its switched-ON state, conventional hysteresis prevention measures may be used.

(ak) With reference to FIG. 5, the Zener diodes (Z1a, Z1b, Z2a, Z2b) provide for an effect quite similar to that of placing a resistor in series with each gate of each FET {as discussed in section (ag) above}; which is to say that they provide for a reduction in the cross-over distortion associated with waveform (a) of FIG. 4, reducing it to a level such as indicated by waveform (aa) of FIG. 6.

(al) In FIG. 5, to permit more leeway in the specifications required of the FET's and the Zener diodes, it is advantageous to bias each of transistors FET1a and FET2b, not only with a single resistor from gate to drain, but also with a resistor from gate to source; which is to say: biasing each of those two transistors by way of a voltage divider.

(am) To protect against electric shock hazard, which otherwise might result due to low-frequency power line voltage being present between Earth Ground and either the AC1 bus and/or the AC2 bus, a low-frequency blocking capacitor may be interposed in series with each of the AC1 bus and the AC2 bus.

(an) The ballasting arrangements of FIGS. 3 and 5 may effectively be used for Rapid-Start ("R.S.") fluorescent lamps as well; in which case low-voltage cathode heating power would be provided by way of auxiliary windings on tank-inductor TI.

To meet the so-called U.L. Pin Test without resorting to using an output (or power line) isolation transformer or an active Ground-Fault ("G.F.") prevention means, R.S. fluorescent lamps may be parallel-powered from the AC output rails (i.e., from the AC1/AC2 buses)—with each R.S. lamp being series-connected with a ballast capacitor to form an R.S. Lamp-Capacitor series-combination, and with each such series-combination being connected directly between the AC buses. Then, as long as the RMS magnitude of the AC output voltage (i.e., the AC voltage provided between the AC buses) is not much higher than what is required for proper rapid-starting of a single R.S. fluorescent lamp, shock-hazard-safe operation will result even in the absence of power line isolation transformer or G.F. prevention means.

(ao) Although tank-capacitor TCab is not connected directly in parallel across tank-inductor TI, it nevertheless functions as a parallel-connected tank-capacitor, thereby making the Bridge Inverter Circuit of FIG. 3 (and that of FIG. 5 as well) a parallel-resonant inverter or ballast circuit. This is so for the reason that—by way of the alternatingly switched bridge transistors—tank-capacitor TCab is commutated in such manner as to interact with the tank-inductor as if it were parallel-connected therewith.

(ap) In the Bridge Inverter Circuit of FIGS. 3 and 5, the exact value of the inductance of inductor EI is not highly critical to the efficient operation of the inverter. Yet, the higher the value of this inductance, the lower the amount of high-frequency ripple current that has to be handled by filter capacitor FCp2.

With reference to waveform (q) of FIG. 4, under a partly loaded condition, the current flowing through the windings of inductor EI is of a relatively high unidirectional magnitude with but a modest amount of high-frequency ripple.

(aq) With reference to the Bridge Inverter Circuits of FIGS. 3 and 5, instead of connecting each auxiliary winding on tank-inductor TI (e.g., AW1b) directly across the gate-source terminals of transistor FET1b, it may in some cases (such as when necessary to limit the peak magnitude of the voltage provided across the gate-source terminals) be preferable to connect the auxiliary winding thereacross by way of a resistor, while at the same time connecting a pair of series-connected back-to-back Zener diodes across the gate-source terminals. That way, even when supplied by a sinusoidal voltage from the auxiliary winding, the drive voltage presented to the gate-source terminals will be closer to a square-wave.

(ar) With reference to FIGS. 3 and 5, it is emphasized that series-combination SCx is merely representative of a plurality of such series-combinations which may all be parallel-connected with each other between the AC1 bus and the AC2 bus (i.e., across the AC rails).

(as) With reference to FIG. 5, in situations where Rapid-Start fluorescent lamps are to be powered from the Bridge Inverter Circuit, cathode heating voltage may advantageously be obtained by way of a small transformer having its primary winding connected in parallel with tank-capacitor TCc, and each of its secondary windings connected with a cathode. That way, cathode heating power would be provided only until all lamps had ignited. Thereafter, as soon as tank-capacitor TCc is switched out by way of transistor FETc, cathode power would cease to be provided, thereby providing for a situation of extra high ballast efficacy factor.

(at) With referene to FIG. 5, in situations where control of light output is desired, the ON/OFF control of transistor FETc can be effectuated by way of an external control means instead of by the automatic action shown.

Thus, for instance, resistor Rc4 may be removed; and control of HEXI—and thereby transistor FETc—may be effectuated by an external battery and switch.

Or, the gate terminal of FETc may be removed from HEXI's terminal OTc2 and connected instead to an external battery by way of a switch.

Alternatively, additional tank-capacitors may be switched in/out by way of additional transistors—with each additional tank-capacitor being switched in/out by its own transistor; and with each tank-capacitor/transistor combination being parallel-connected across winding AWc.

Thus, by switching in/out additional tank-capacitors, the amount of power delivered to the gas discharge lamps powered by the parallel-resonant-type electronic ballast of FIG. 5 may be controlled over a relatively wide range; something which is not possible to accomplish with ordinary parallel-resonant-type electronic ballasts.

Also, the amount of powered delivered to the gas discharge lamps may be controlled to an additional degree by controlling the magnitude of the DC supply voltage; which can be effectuated by controlling the magnitude of the resistance placed in parallel with resistor Rp5.

In this connection it is important to note that only gas discharge lamps with externally heated cathodes (e.g., Rapid-Start fluorescent lamps) are suitable for wide-range control of lamp power.

(au) With reference to section (at) above, it is noted that in situations where electrical isolation from the powewr line is desired, external lamp power control can be effectuated with one or more tank-capacitors being switched in/out across a separate auxiliary winding (e.g., a winding labeled AWi) on tank-inductor TI.

(av) With respect to current flowing through an ordinary transistor, forward current is defined as the current flowing between the source terminal and the drain terminal in case of a field-effect transistor, or between the emitter terminal and the collector terminal in a bi-polar transistor, without flowing through any built-in commutating diode or diode-junction. Thus, whereas the magnitude of any reverse current which might flow through a transistor (e.g., through a built-in commutating diode) can not be controlled by way of the transistor's control terminals, the magnitude of the forward current can be controlled by application of a controllable voltage (in case of FET's) or current (in case of bi-polar transistors) to the transistor's control input terminals (i.e., the gate-source terminals of a FET or the base-emitter terminals of a bi-polar transistor).

(aw) The term "substantially sinusoidal waveform" is to be understood to apply to a waveform where, with respect to a purely sinusoidal waveform, the total harmonic distortion is no higher than 20%.

This definition notwithstanding, the total harmonic distortion of the various substantially sinusoidal waveforms associated with the inverter circuits of FIGS. 3 and 5 {e.g., waveforms (a) through (d), (g), (i), (j) through (m), (p), (q), (aa) and (ac) of FIGS. 4 and 6} is actually only about 10% or less.

(ax) In the inverter circuits of FIGS. 3 and 5, and as indicated by waveform (ae) and (af), a periodically pulsed unidirectional voltage exists across each field-effect transistor (e.g. FET1a); with each individual voltage pulse being equal to a complete half-cycle of a substantially sinusoidal voltage; with each such half-cycle being defined as having its beginning and its end at a cross-over point; with a cross-over point being defined as a point at which the instantaneous magnitude of the substantially sinusoidal voltage reverses polarity.

(ay) Even though not expressly so indicated, the fluorescent lamps of FIGS. 3 and 5 are disconnectable.

(az) With reference to waveforms (ad) and (ac) of FIG. 6, the current flowing through fluoresent lamp ISFLx (i.e., the lamp current) has a waveform which is composed of two principal components: (i) a substantially sinusoidal wave component of relatively large magnitude; and (ii) a squarewave component of relatively small magnitude.

The squarewave component is characterized as having cross-over points (i.e., phasing) displaced by about one quarter period (i.e., by about 90 degrees) from the cross-over points of the sinusoidal wave component.

The peak-to-peak magnitude of the squarewave component is equal to the height of the voltage-step occurring at the crest of the lamp current waveform.

(ba) Inductor EI (i.e., the inverter's feed inductor) may be located in series with either conductor connecting the bridge inverter to the source of DC supply voltage. However, to minimize EMI, as well as to minimize electric shock hazard associated with the inverter's output terminals (i.e., the AC1.AC2 buses), the feed inductor should be split, as indicated in FIG. 3.

(bb) In ordinary parallel-resonant-type electronic ballasts, the peak magnitude of the voltage existing across each transistor in the ballast's inverter is larger than pi times half of the magnitude of the DC voltage supplying the inverter, where pi is equal to 3.14.

In fact, in a parallel-resonant-type electronic ballast of the kind presently available in the U.S. market, such peak magnitudes were measured to exceed 3.4 times the magnitude of the DC supply voltage.

(bc) With reference to FIG. 5, it is noted that the complete inverter circuit used for converting the DC supply voltage (i.e., the DC voltage provided between the B− bus and the B+ bus) to the the substantially sinusoidal AC output voltage (i.e., the voltage provided between junctions J1 and J2) consists of only 13 individual components, namely: EI, TI, TCab, FET1a, FET1b, FET2a, FET2b, Z1a, Z1b, Z2a, Z2b, R1a and R2b.

DESCRIPTION OF THE THIRD EMBODIMENT

Details of Construction of Third Embodiment

FIG. 7, which consists of FIGS. 7A and 7B, which should be viewed together schematically illustrates the third embodiment of the invention.

In FIG. 7, bridge rectifier BR is connected with power line source S and provides a non-filtered full-wave-rectified power line voltage voltage between the DC− terminal and the DC+ terminal; across which two terminals is connected high-frequency filter capacitor HFFC.

The DC− terminal is connected with the B− bus.

An energy-storing inductor Lx is connected between the DC+ terminal and an auxiliary junction AJx1. The drain terminal of a field effect transistor FETx is connected with another auxiliary junction AJx2; the source terminal of transistor FETx is connected with the B− bus by way of a current-sensing resistor Rx1; and the gate terminal of transistor FETx is connected with terminal 7 of pre-converter IC PCIC, whose terminal 4 is connected with the source terminal of transistor FETx.

Otherwise, the terminals of pre-converter IC PCIC are connected as follows: terminal 6 is connected directly with the DC− bus; terminal 3 is connected with the B− bus by way of a capacitor Cx1, which is parallel-connected with a resistor Rx2; terminal 3 is also connected with the DC+ terminal by way of a resistor Rx3; terminal 2 is connected with terminal 8 by way of a capacitor Cx2; terminal 8 is connected with the B− bus by way of a filter capacitor Cx3; terminal 5 is connected by way of a resistor Rx4 to the anode of a diode Dx1, whose cathode is connected with terminal 8; and terminal 1 is connected directly with the cathode of a diode Dx2 as well as with the cathode of a diode Dx3.

An auxiliary winding AWx1 on inductor Lx is connected between the B− bus and the anode of diode Dx1.

The anode of a high-speed rectifier HSRx is connected with junction AJx2; while the cathode of this rectifier is connected with the B+ bus. Another auxiliary winding AWx2 on inductor Lx is connected between the B+ bus and the cathode of a diode Dx4, whose anode is connected with the B+ bus by way of a filter capacitor Cx4. A resistor Rx5 is connected between the anode of diode Dx4 and the anode of diode Dx2; which anode is connected with the B− bus by way of a resistor Rx6. A resistor Rx7 is connected between the B+ bus and the anode of diode Dx3; which anode is connected to the B− bus by way of a resistor Rx8.

A main DC filter capacitor FCx is connected between the B− bus and the B+ bus.

A capacitor Cx5 is connected between the B+ bus and the gate terminal of a field effect transistor FETx1, whose source terminal is connected with the B− bus, and whose drain terminal is connected with the anode of diode Dx2. A zener diode Zx is connected with its cathode to the gate terminal of transistor FETx1 and with its anode to the B− bus. A resistor Rx9 is connected in parallel with Zener diode Zx.

Auxiliary junctions AJx1 and AJx2 (which are found on the part of FIG. 7 labeled Pre-Converter Circuit) are connected with the terminals of an auxiliary winding AWy wound on a main transformer MTy (which main transformer MTy is found on the part of FIG. 7 labeled Bridge Inverter Circuit).

Otherwise, while the B— bus is connected directly with a BIy— bus, an inductor Ly is connected between the B+ bus and a BIy+ bus. A capacitor Cy is connected between the BIy— bus and the BIy+ bus. A field effect transistor FETy1$a$ is connected with its drain terminal with the BIy+ bus and with its source terminal to a junction Jy1; while a field effect transistor FETy1$b$ is connected with its drain terminal to junction Jy1 and with its source terminal to the BIy— bus. Similarly, a field effect transistor FETy2$a$ is connected with its drain terminal with the BIy+ bus and with its source terminal to a junction Jy2; while a field effect transistor FETy2$b$ is connected with its drain terminal to junction Jy2 and with its source terminal to the BTy— bus.

A primary winding PWy on main transformer MTy is connected between junctions Jy1 and Jy2; and a secondary winding SWy is connected between a pair of AC rails ACy1 and ACy2; across which AC rails are connected a number of lamp-ballast series-combinations Scy1, SCy2: series-combination Scy1 consisting of ballast capacitor BCy1 series-connected with instant-start fluorescent lamp FLy1; series-combination SCy2 consisting of ballast capacitor BCy2 series-connected with instant-start fluorescent lamp FLy2.

Main transformer MTy has four feedback windings FWy1$a$, FWy1$b$, FWy2$a$, FWy2$b$; one terminal of each being connected with the source terminal of transistors FETy1$a$, FETy1$b$, FETy2$a$, FETy2$b$; the other one terminal of each being connected with the anode of each of Zener diodes Zy1$a$, Zy1$b$, Zy2$a$, Zy2$b$; whose cathodes are connected with the gate terminals of transistors FETy1$a$, FETy1$b$, FETy2$a$, FETy2$b$, all respectively.

Details of Operation of the Third Embodiment

With reference to FIG. 7, the operation of the third embodiment is described and explained as follows.

The operation of the Pre-Converter Circuit of FIG. 7 is substantially conventional except that, during normal steady-state operation, the absolute magnitude of the DC rail voltage (i.e., the absolute magnitude of the DC voltage present between the B— bus and the B+ bus) is regulated so as to be higher by a given predetermined amount than the peak absolute magnitude of the AC power line voltage provided at the AC input terminals to bridge rectifier BR. Thus, as the magnitude of the AC power line voltage changes, the magnitude of the DC rail voltage changes accordingly.

That is, during normal steady-state operation, the Pre-Converter Circuit is arranged to regulate in such manner as to maintain substantially constant the difference between the magnitude of the DC rail voltage and the peak magnitude of the power line voltage; which contrasts with the usual practice of maintaining the magnitude of the DC rail voltage itself constant, substantially irrespective of changes in the magnitude of the AC power line voltage.

{For additional explanation with respect to how a conventional pre-converter circuit operates, particular reference is made to FIG. 19 (and associated explanations) of a published report from Motorola Inc. entitled Motorola Semiconductor Technical Data and pertaining to Motorola's Power Factor Controller MC34262.}

During normal steady-state operation of the Pre-Converter Circuit, transistor FETx1 is non-conductive; and regulation derives from the magnitude of the DC voltage existing across resistor Rx6; which magnitude, in turn, is a direct measure of the difference between the magnitude of the DC voltage present at the B+ bus and the magnitude of the DC voltage present across capacitor Cx4; which latter magnitude is a direct measure of the peak magnitude of the pulsating voltage present between the DC— terminal and the DC+ terminal; which, in turn, is a direct measure of the peak magnitude of the AC power line voltage applied to the AC input terminals of bridge rectifier BR.

The polarity of, and the number of turns on, auxiliary winding AWx2 are arranged so that the instantaneous absolute magnitude of the DC voltage developing across filter capacitor Cx4 is equal to that of the DC voltage present between the DC— and the DC+ terminals. Thus, with the polarity of the DC voltage across capacitor Cx4 arranged as shown in FIG. 7, the magnitude of the DC voltage present at the anode of diode Dx4 is equal to the difference between the magnitude of the DC rail voltage (as present between the B— bus and the B+ bus) and the magnitude of the unfiltered full-wave-rectified AC power line voltage (as present between the DC— and DC+ terminals).

That is, via a first feedback path going through diode Dx2, the Pre-Converter Circuit functions to regulate the absolute magnitude of the DC rail voltage to be higher than the peak absolute magnitude of the AC power line voltage by a certain differential amount.

However, as a safety feature, irrespective of the difference between the magnitude of the DC rail voltage and the peak magnitude of the AC power line voltage, by way of a second feedback path going through diode Dx3, the magnitude of the DC rail voltage is absolutely prevented from exceeding a certain maximum level; which certain maximum level is determined by the magnitude of the DC voltage present across resistor Rx8.

That is, pre-converter IC PCIC controls the magnitude of the DC rail voltage to be higher than the peak magnitude of the AC power line voltage by a certain differential amount, but nevertheless prevents the magnitude of the DC rail voltage from ever exceeding a certain maximum level (which, for instance, could occur if the peak magnitude of the AC power line voltage were to be higher than normally would be the case).

When the AC power line voltage is initially connected with the AC input terminals of bridge rectifier BR, the magnitude of the DC rail voltage increases rapidly (i.e., within half a cycle of the AC power line voltage) to an initial relatively high level. This increase in the magnitude of the DC rail voltage causes the magnitude of the DC voltage at the gate terminal of transistor FETx1 to increase to the point of being limited by the Zener voltage of Zener diode Zx, thereby causing transistor FETx1 to become conductive. With transistor FETx1 conductive, said first feedback path is disrupted, thereby—as long a transistor FETx1 remains conductive, and regardless of the magnitude of the AC power line voltage—causing the magnitude of the DC rail voltage to be regulated to its maximum level; which maximum level is reached within a few half-cycles of the AC power line voltage.

However, after a brief period (e.g., about 100 milliseconds), by action of leakage resistor Rx9, the magnitude of the DC voltage at the gate terminal of transistor FETx1 diminishes to a level where transistor FETx1 ceases to be conductive, whereafter the first feedback path is restored and the magnitude of the DC rail voltage reverts to whatever level is dictated thereby.

The Bridge Inverter Circuit of FIG. 7 operates substantially like that of FIG. 5, except as follows.

The Bridge Inverter Circuit of FIG. 7: (i) uses an isolation transformer in the output stage; and (ii) is triggered into self-oscillation by having the current flowing through energy-storing inductor Lx of the Pre-Converter Circuit also flow through auxiliary winding AWy, which consists of one or a few turns coupled with the other windings of main transformer MTy.

On initial power-up, the magnitude of the DC rail voltage rapidly (e.g., within a few half-cycle of the AC power line voltage) reaches its predetermined maximum level; which maximum level is sufficiently high to cause fluorescent lamps FLy1, FLy2 to ignite properly; which they will do within about 100 milliseconds; whereafter the magnitude of the DC rail voltage will diminish to a point of being just a small amount (e.g., 20 Volt) higher than the peak magnitude of the AC power line voltage.

Additional Comments re Third Embodiment (bd) During ordinary steady-state operation, the peak magnitude of the substantially sinusoidal voltage applied between the gate and source terminals of each of transistors FETy1a, FETy1b, FETy2a, FETy2b is not higher than 20 Volt; which is within the normal steady-state rating for FET power devices.

(be) With each of the power FET's of the Bridge Inverter Circuit of FIG. 7 having a threshold voltage of about 4.2 Volt, the Zener voltage of the gate-connected Zener diodes should be about 3 Volt.

The purpose of the gate-connected Zener diodes is that of making the waveform of the voltage generated by the Bridge Inverter Circuit closer to perfectly sinusoidal, thereby to improve the crest factor of the resulting lamp current. The preferred Zener voltage is that which provides for minimum lamp current crest factor.

(bf) The voyage and current waveforms associated with the preferred embodiment of FIG. 7 are basically the same as those associated with the embodiments of FIGS. 3 and 5.

More particularly, with respect to the Bridge Inverter Circuit of FIG. 7:

1. The alternating component of the voltage present at junction Jy1 (or at junction Jy2)—as referenced to the B− bus (or to the B+ bus)—is substantially of sinusoidal waveform, as is the AC voltage present between junctions Jy1 and Jy2. That is, the AC voltage present at junction Jy1 (or between junctions Jy1 and Jy2) has a waveform like that of Waveform (aa) FIG. 6.
2. The voltage present at the BIy+ bus—as referenced to the B− bus—is like Waveform (r) of FIG. 4.
3. The voltage present at the drain terminal of transistor FET1yb (or FETy2b)—as reference to the B− bus—has a waveform like Waveform (ae) of FIG. 6.
4. The waveform of the current flowing through inductor Ly is as illustrated by Waveforms (h) and (i) of FIG. 4.
5. The current flowing through one of the fluorescent lamps has a waveform like Waveforms (ab) or (ad) of FIG. 6.

(bg) It is noted that Waveforms (ab) and (ad) of FIG. 6 consists of a pure sinewave to which is added a squarewave (of substantially lower magnitude) whose phasing—as referenced to the squarewave's fundamental component—is displaced by 90 degrees.

(bh) A field effect transistor is usually controlled by application of a squarewave-shaped drive voltage between its gate and source terminals; which is in sharp contrast with the roughly sinusoidally-shaped drive voltage applied between the gate-source terminals of the field effect transistors in the bridge inverter circuits of the present invention.

Note: Compared with a pure sinewave, the total harmonic distortion of a squarewave is 50%.

(bi) Tank-capacitor C and tank-inductor L of FIG. 1 are parallel-connected and represents an LC tank circuit having a natural resonance frequency. FIGS. 3, 5 and 7 similarly each includes an LC tank circuit. In the Bridge Inverter Circuit of FIG. 7, the tank-inductor is represented by the effective shunt inductance of transformer MTy; and, prior to lamp ignition, the tank-capacitor is capacitor Cy. After lamp ignition, ballast capacitors BCy1, BCy2 effectively add to the tank capacitor.

(bj) As for instance indicated by Waveforms (a) and (e) of FIG. 4, for a very brief period each half-cycle {at or near the cross-over points of the substantially sinusoidal waveform represented by Waveform (a)}, none of the four field effect transistors of the Bridge Inverter Circuit (e.g., the one illustrated by FIG. 7) conducts; which is to say, during these brief periods, the inductive current flowing through the feed inductor (e.g., Ly of FIG. 7) has no place to flow except into the tank-capacitor (e.g., Cy of FIG. 7).

(bk) Each of the Bridge Inverter Circuits of FIGS. 3, 5 and 7 is a so-called self-oscillating inverter; which is to say, each inverter is made to self-oscillate by providing the periodic drive voltage required for operating each of the field effect transistors via positive feedback derived from the inverter's output.

DESCRIPTION OF THE FOURTH EMBODIMENT

Details of Construction of Fourth Embodiment

FIG. 8 illustrates the presently preferred embodiment of the dual full-bridge inverter ballast.

In FIG. 8, two full-bridge inverters are series-connected between the BIy− bus and the BIy+ bus; which BIy− bus and BIy+ bus are connected with the B− bus and B+ bus by way of inductor windings L″y and L′y, all respectively. Each of these two full-bridge inverters is substantially identical to the single full-bridge inverter of the Bridge Inverter Circuit of FIG. 7, except that auxiliary winding AWy is removed for clarity, and primary windings PW′y and PW″y are both wound on the magnetic core of main transformer MTy.

Otherwise, the primed and the double-primed elements of FIG. 8 correspond to the like-named unprimed elements of FIG. 7.

In other words, main transformer MTy includes each of the following windings: PW′y, PW″y, FW′y1a, FW″y1a, FW′y2a, FW″y2a, FW′y1b, FW″y1b, FW′y2b, FW″y2b, and SWy.

As with the arrangement of FIG. 7, the two terminals of secondary winding SWy are connected with a lamp load; which is to say: with elements such as Scy1 (which includes FLy1 and BCy1) and SCy2 (which includes FLy2 and BCy2) of FIG. 7.

Details of Operation of Fourth Embodiment

Each of the two full-bridge inverter circuits of FIG. 8 operates in the same manner as does the single full-bridge inverter circuit of FIG. 7. However, due to the voltage-dividing action of capacitors C'y and C"y (with the capacitance of C'y being equal to that of C"y), only half of the voltage present between the BIy− bus and the BIy+ bus will appear across each of the two full-bridge inverters; which therefore means that the transistors of each of the two full-bridge inverters need only support half the voltage required if only a single full-bridge had been connected between the BIy− bus and the BIy+ bus.

For instance, with the magnitude of the DC supply voltage provided between the B− bus and the B+ bus being equal to 520 Volt (which might reasonably result with a pre-converter powered from a 277 Volt power line voltage) the peak magnitude of the voltage between the BIy− bus and the BIy+ bus would be about 820 Volt; which, if a single full-bridge inverter were used, would require FET's with a voltage rating of 820 Volt; but which, if two series-connected full-bridge inverters were used, would require FET's with a voltage rating of only 410 Volt.

Additional Comments re Fourth Embodiment (bl) As is the case with the other full-bridge inverter-type ballast circuits described herein, at least in some situations, it is not necessary to split the windings of the DC feed-inductor means (e.g., IM, EI, Ly). Thus, inductors L'y and L"y could be a single inductor placed in either one of the DC feedlines.

(bm) In the circuit arrangement of FIG. 8, there is no need for having the upper and lower full-bridge inverter circuits operate in exact symmetry. Provided proper phasings are observed, the FET's can be arranged such that, for instance, when at some given time FET'y1a is ON simultaneously with FET'y2b, it is not necessary that FET"y1a and FET"y2b also be ON at that time. Thus, provided proper relative phasing is observed between primary windings PW'y and PW"y, rather than FET"y1a and FET"y2b being ON at that time, FET"y2a and FET"y1b could be ON instead.

(bn) Since the rate-of-rise of the voltage across any FET in the inverter circuit of FIG. 8 is particularly low, the exact timing of the OFF-switching of each transistor is not critical.

(bo) The circuit arrangement of FIG. 8 may be considered as being two series-connected parallel-resonant full-bridge inverters (of a type such as the Bridge Inverter Circuit of FIG. 7) with their oscillations synchronized and their waveforms equalized, and with a common tank inductor and output transformer.

(bp) The basic concept of series-connecting two or more synchronized inverters across a common DC supply voltage—while at the same time joining their outputs via a common transformer—may be used with inverters other than full-bridge inverters, such as half-bridge inverters, push-pull inverters, single-ended inverters, etc. However, to avoid potentially severe problems with circulating currents and/or excessive switching voltage transients, it is important to arrange for the waveforms to be equalized and the rate-of-rise of the voltage across the inverter's transistors to be low compared with the transistors' own turn-OFF time.

DESCRIPTION OF THE FIFTH EMBODIMENT

Details re Construction of Fifth Embodiment

FIG. 9 schematically illustrates an alternative to the presently preferred embodiment.

In FIG. 9, for sake of clarity, most of the elements have not been labeled with a reference symbol. However, each element of the circuit arrangement of FIG. 9 finds correspondence in the Bridge Inverter Circuit of FIG. 7.

That is, the full-bridge inverter circuit of FIG. 9 is the same as that of the Bridge Inverter Circuit of FIG. 7, except that each FET in the Bridge Inverter Circuit of FIG. 7 has been replaced with a pair of series-connected FET's labeled PFET, with each of the series-connected FET's having a parallel-connected voltage-limiting commutation diode VLCD and being driven (via its own individual Zener diode) from its own individual drive winding on the main transformer (MTy).

Otherwise, the reference symbols used in FIG. 9 correspond to those used in FIG. 8.

Details re Operation of Fifth Embodiment

Except for details with respect to the operation of the four series-connected pairs of FET's (i.e., the PFET's), the full-bridge inverter circuit of FIG. 9 functions in a manner substantially identical to that of the Bridge Inverter Circuit of FIG. 7.

Just as is the case in the Bridge Inverter Circuit of FIG. 7, the rate-of-rise of the voltage across the transistors in the full-bridge inverter circuit of FIG. 9 is restrained to a very substantial degree by tank capacitor Cy. As a result, the rate-of-rise of the voltage across each transistor is extremely slow in comparison to the transistor's own switch-OFF and/or switch-ON times.

The extremely slow rate-of-rise of transistor voltages associated with the circuit of FIG. 9 is in sharp contrast with the situation prevailing in ordinary inverters and permits plural ordinary switching transistors to be operated in series provided they are each individually switched OFF and ON at approximately the same time; which is exactly what is achieved by driving each transistor of each pair of series-connnected FET's with close-to-exactly the same control voltage.

It is re-emphasized that each of the series-connected FET's has a voltage-limiting means VLCD (i.e., a so-called avalanche diode) connected between its source and drain, thereby to prevent each one of the transistors from being exposed to more voltage than it is intended to withstand.

As a alternative to avalanche diodes, voltage-dividing resistors or capacitors may be used.

Finally, it is noted that—due to inherent differences in their switching characteristics—it is more difficult to series-operate two bipolar transistors than it is to series-operate two field effect transistors. Thus, while two FET's can be effectively series-operated with but a modest degree of slow-down in the rate-of-rise of the transistor's output voltage, a substantially higher degree of slow-down is generally required with bipolar transistors.

DESCRIPTION OF THE PREFERRED EMBODIMENT

Details of Construction of Preferred Embodiment

FIG. 10 represents a schematic circuit diagram of the preferred embodiment.

In FIG. 10:

The B− bus, the B+ bus and the A+ bus are connected respectively with the corresponding B− bus, B+ bus and A+ bus of a pre-converter circuit such as that of the Pre-Converter Circuit of FIG. 5;

A field effect transistor FETz1a is connected with its drain terminal to the B+ bus and with its source terminal to a junction Jz1; a field effect transistor FETz1b is connected with its drain terminal to junction Jz1 and with its source terminal to the B− bus; a field effect transistor FETz2a is connected with its drain terminal to the B+ bus and with its source terminal to a junction Jz2; and a field effect transistor FETz2b is connected with its drain terminal to junction Jz2 and with its source terminal to the B− bus;

A timer Tz has: a terminal TTzb connected with the B− bus; a terminal TTza connected with the A+ bus; a terminal TTz1 connected with the gate terminal of transistor FETz1b by way of a parallel-combination of a resistor Rz1 and a diode Dz1, whose anode is connected with the gate terminal of FETz1b; a terminal TTz2 connected with the gate terminal of transistor FETz2b by way of a parallel-combination of a resistor Rz2 and a diode Dz2, whose anode is connected with the gate terminal of FETz2b; a terminal TTz3 connected with terminal TTz2 by way of a timing resistor Rzt and with the B− bus by way of a timing capacitor Czt; and a terminal TTz4 connected with the B− bus by way of a filtering capacitor Czf;

A main transformer MTz has: a primary winding PWz connected in series with a DC blocking capacitor Cz, thereby to form a series-combination, which series-combination is connected between junctions Jz1 and Jz2; a first drive winding DWz1 connected between the gate terminal and the source terminal of transistor FETz1a; a second drive winding DWz2 connected between the gate terminal and the source terminal of transistor FETz2a; and an auxiliary winding AWz whose terminals are connected with a pair of conductors supplying triggering signal current, such as those conductors to which the terminals of auxiliary winding AWy of the Bridge Inverter Circuit of FIG. 7 are connected;

Main transformer MTz also has: a secondary winding SWz connected between output terminals OTz1 and OTz2; a first main cathode winding CWzm1; a second main heating winding CWzm2; and a third main heating winding CWzm3;

A current-limiting or ballasting inductor Lz is connected between output terminal OTz1 and an output junction OJz;

Inductor Lz has: a first auxiliary cathode winding CWza1; a second auxiliary cathode winding CWza2; and a third auxiliary cathode winding CWza3;

A tuning capacitor TCz is connected between output junction OJz and output terminal OTz2;

A first Rapid-Start fluorescent lamp FLz1 has a first and a second pair of cathode terminals CTz1a and CTz1b; a second Rapid-Start fluorescent lamp FLz2 has a first and second pair of cathode terminals CTz2a and CTz2b;

Cathode terminals CTz1b are parallel-connected with cathode terminals CTz2a;

Main cathode winding CWzm1 is series-connected with auxiliary cathode winding CWza1 and the resulting series-combination is connected across cathode terminals CTz1a; main cathode winding CWzm2 is series-connected with auxiliary cathode winding CWza2 and the resulting series-combination is connected across the parallel-connection of cathode terminals CTz1b and CTz2a; and main cathode winding CWzm3 is series-connected with auxiliary cathode winding CWza3 and the resulting series-combination is connected across cathode terminals CTz2b.

Details of Operation of Preferred Embodiment

In the circuit of FIG. 10, timer Tz (which, in an actual circuit implementaion, is TI timer TLC 556) provides gate drive signals to transistors FETz1b and FETz2b, causing these transistors alternatingly and periodically to be turned ON and OFF at a frequency of about 30 kHz—with one the transistors always being OFF when the other transistor is ON, and vice versa.

The purpose of resistors Rz1 and Rz2 is that of providing a slight delay in the turning-ON of the associated transistors; while the purpose of diodes Dz1 and Dz2 is that of preventing the same delay from taking place in the turning-OFF of the associated transistors.

The frequency of the drive signals provided by timer Tz is basically determined by the choice of values for timing resistor Rzt abd timing capacitor Czt. However, some degree of adjustment of this frequency may be accomplished by modifying the magnitude of the voltage developing across capacitor Czf.

However, even with transistors FETz1b and FETz2b alternatingly and periodically switched ON and OFF, a corresponding output voltage will not necessarily be provided across primary winding PWz. This is so for the reason that—without making express provisions to the contrary—transistors FET1a and FET2a will both remain OFF, thereby preventing B+ voltage from being applied to transistors FETz1b and FETz2b.

That is, transistors FETz1a and FETz2a will only turn ON and OFF when drive signals are provided from drive windings DWz1 and DWz2; which drive signals can only be provided when an AC voltage is present across primary winding PWz.

To overcome the problem associated with the absence of B+ voltage on the drain terminals of transistors FETz2a and FETz2b (which prevents an AC voltage from developing across primary winding PW), an alternating triggering current is fed through auxiliary winding AWz. The effect of supplying this triggering current is that of causing an AC voltage to exist across primary winding PWz as well as across drive windings DWz1 and DWz2, thereby cusing transistors FETz1a and FETz2a alternatingly to turn ON and OFF, thereby causing the drain terminals of transistors FETz1b and FETz2b to be supplied with B+ voltage; thereby, in turn, causing the whole full-bridge inverter to latch into operation.

Since the loading on main transformer MTz is very small prior to initiation of inverter operation, the magnitude of the triggering current need only be very modest. In fact, to minimize inefficiency, it should be very much smaller than the magnitude of the resulting inverter output current.

The magnitudes of the voltages developing as a result of the triggering current at the bases of transistors FETz1a and FETz2a are prevented from exceeding safe levels for the reason that primary winding PWz is clamped by way of the reverse diodes associated with each of the four inverter transistors. That is, these four diodes are connected as a full-bridge rectifier whose AC input terminals are connected across the terminals of primary winding PWz and whose DC output terminals are connected between the DC supply terminals (i.e., the B− bus and the B+ bus).

Thus, with an alternating current being provided to auxiliary winding AWz, the full-bridge inverter of FIG. 10 will automatically enter into proper full-bridge operation even though only two of the four transistors are being provided with drive signals. Moreover, the frequency of operation will be exactly that called-for by the timer (Tz).

After the full-bridge inverter has started operation, the trigger current may be removed. However, such removal is normally not necessary.

When the full-bridge inverter circuit of FIG. 10 exists in its normal state of operation, an alternating squarewave voltage exists across inverter output terminals Jz1 and Jz2. The frequency of this squarewave voltage is about 30 kHz—as determined by timing resistor Rzt and timing capacitor Czt. Its peak-to-peak magnitude is substantially equal to the magnitude of the DC supply voltage.

Via DC blocking capacitor Cz, the 30 kHz squarewave voltage is applied across primary winding PWz; and therefore appears across output terminals OTz1 and OTz2 as well. Thus, the final full-bridge 30 kHz inverter squarewave output voltage exists across output terminals OTz1/OTz2 and is applied across the series-combination of ballasting inductor Lz and tuning capacitor TCz; which tuning capacitor is selected so that the natural L-C series-resonance frequency is substantially higher than the 30 kHz inverter frequency, but at the same time substantially lower than the third harmonic component of the inverter frequency. The main purpose of capacitor Cz is that of suppressing spurious resonances at harmonics of the inverter frequency.

During the period prior to lamp ignition, heating of the cathodes of fluorescent lamps FLz1/FLz2 is accomplished by the voltage provided from each of windings CWzm1/CWzm2/CWzm3; during which pre-ignition period the magnitude of the voltage provided at each of windings CWza1/CWza2/CWza3—which is added to the voltage of windings CWzm1/CWzm2/CWzm3, respectively—is relatively low and neither substantially adds to, nor substantially subtracts from, the magnitude of the cathode heating voltage as provided from windings CWzm1/CWzm2/CWzm3.

After lamp ignition, the full lamp current flows through inductor Lz and the magnitude of the voltage provided at each of windings CWza1/CWza2/CWza3 is relatively high, thereby to a substantive degree subtracting from the magnitude of the cathode heating voltage provided from windings CWzm1/CWzm2/CWzm3.

As an overall net result, the magnitude of the cathode heating voltage is about 3.6 Volt RMS prior to lamp ignition and about 2.5 Volt RMS after lamp ignition; which therefore, without degradation of lamp life, provides for a substantial reduction in total lamp operating power without a commensurate reduction in light output; which, in turn, results in a significant increase in luminous efficacy.

Comments re Preferred Embodiment (ca) With reference to the circuit diagram of FIG. 10, the waveform of the drive voltage provided from timer terminal TTz1 is a squarewave. However, due to action of diode-resistor network Dz1/Rz1, the drive voltage actually applied to the gate-source input of transistor FETz1b has a waveform that is a modified squarewave in that it has a slowed-down rise-time. In particular, resistor Rz1, in combination with the transistor's internal gate-source capacitance, provides for a sloweddown rise time, thereby preventing transistor FETz1b from being switched ON before transistor FETz1a has been switched OFF. However, due to the action of diode Dz1, no corresponding slow-down is provided with respect to the squarewave's fall-time.

Exept for being 180 degress out of phase, the waveform of the drive voltage provided at the gate-source input of transistor FETz2b is the same as that provided at the gate-source input of transistor FETz1b.

However, the waveform of the gate-source drive voltage provided to each of transistors FETz1a and FETz2a is in effect an unmodified squarewave.

As long as transistors FETz1b and FETz2b are prevented from conducting simultaneously with transistors FETz1a and FETz2a, there is no need to drive transistors FETz1a and FETz2a with a voltage having a waveform other than a squarewave.

However, as long as the inverter's load includes an inductive component, driving transistors FETz1b and FETz2b with the indicated modified squarewave voltage nevertheless results in an inverter output voltage with a square waveform; which therefore causes the drive voltages provided to the gate-source terminals of transistors FETz1a and FETz2a to have a square waveform.

(cb) The operation of the inverter of FIG. 10 is initiated by way of an initiation signal provided to auxiliary winding AWz. If not providing this (or some equivalent) initiation signal, the inverter will fail to provide an output voltage. However, once the inverter's output voltage has been established, no further initiation signal need be provided.

An alternative way of providing an initiation signal is to connect a small-value capacitor between the gate terminal of transistor FETz1a and the drain terminal of the switching transistor in the Pre-Converter Circuit (e.g., transistor FETx of the Pre-Converter Circuit of FIG. 7) used for powering the Full-Bridge Inverter Circuit of FIG. 10.

(cc) Since a transformer winding is connected directly across the gate-source terminals of each of transistors FETz1a and FETz2a, the average magnitude of the voltage present across these gate-source terminals must by inherent necessity be zero.

On the other hand, the average magnitude of the voltage present across the gate-source terminals of each of transistors FETz1b and FETz2b will not be zero. Instead, it will be approximately be equal to half the magnitude of the A+ voltage.

Of course, the average magnitude of a periodic signal—such as those existing across the gate-source terminals of transistors FETz1a, FETz2a, FETz1b, and FETz2b—is the average value obtained when averaging over one or more complete cycles of the periodic signal.

(cd) The frequency of the AC voltage provided at output terminals Jz1 and Jz2 of the full-bridge inverter of FIG. 10 is entirely determined by the frequency of the drive signal provided at terminals TTz1 and TTz2 of timer Tz.

The waveform of the inverter's AC output voltage is that of a squarewave.

(ce) By supplying a current to terminal TTz4, the frequency of the timer's output voltages can be adjusted, thereby to attain some desirable effect (such as lamp dimming).

Of course, this frequency may be automatically adjusted as a function of some suitable control signal (such as the magnitude of the lamp current), thereby to attain some desired effect (such as a reduction in the magnitude of the cathode heating voltage after lamp ignition).

(cf) In FIG. 10, the cathode heating voltage (i.e., the voltage applied to each of the cathodes of fluorescent lamps FLz1 and FLz2) consists of the sum of two individual voltages. Thus, with respect to exemplary cathode CTz1a, the net cathode heating voltage provided to cathode CTz1a is the sum of the main cathode voltage provided from winding CWzm1 and the auxiliary cathode voltage provided from winding CWza1.

Prior to lamp ignition (i.e., when a relatively small amount of current flows through inductor Lz), the net total cathode heating voltage consists mainly of the main cathode voltage provided from winding CWzm1: the auxiliary cathode voltage from winding CWza1 then having only a minor impact on the net total.

After lamp ignition (i.e., when a relatively large amount of current flows through inductor Lz), the net total cathode heating voltage consists of the main cathode voltage provided from winding CWzm1 (which is the same as it was prior to lamp ignition) plus the auxiliary cathode voltage provided from winding CWza1; the magnitude of which auxiliary cathode voltage is now of substantial and does have an impact on the net total cathode heating voltage. Thus, with appropriate phasing of winding CWza1, the magnitude of the net total cathode heating voltage is caused to diminish after lamp ignition.

Since the waveform and phasing of the auxiliary cathode voltage can not readily be made equal to those of the main cathode voltage, it is not straight-forwardly possible to get complete cancellation of the net cathode heating voltage after lamp ignition. However, a reduction of more than 33% is readily attainable.

I claim:
1. An arrangement comprising:
   a DC source providing a DC supply voltage at a pair of DC supply terminals;
   a drive source providing a primary drive signal at a pair of drive source terminals;
   an inverter circuit having a pair of DC input terminals connected with the DC supply terminals and being operable to provide an inverter output voltage at a pair of inverter output terminals; the inverter circuit being further characterized by having a first and a second switching transistor with a first and a second pair of control input terminals, respectively; the first pair of control input terminals being connected with the drive signal output terminals, thereby to be provided with the primary drive signal; the drive signal causing the first switching transistor to be alternatingly switched ON and OFF in a periodic manner; the second pair of control input terminals being connected in circuit with the inverter output terminals, thereby to obtain a secondary drive signal therefrom; and
   a gas discharge lamp connected in circuit with the inverter output terminals.

2. The arrangement of claim 1 further characterized in that the secondary drive signal has a waveform distinctly different from that of the primary drive signal.

3. The arrangement of claim 1 wherein: (i) the primary drive signal is characterized by having an average magnitude distinctly different from zero; and (ii) the secondary drive signal is characterized by having an average magnitude not distinctly different from zero.

4. The arrangement of claim 1 wherein the drive source is further characterized by including: (i) an auxiliary pair of DC input terminals across which exists an auxiliary DC voltage the magnitude of which is substantially lower than that of the DC supply voltage; and (ii) timing means operative to determine the frequency of the primary drive signal.

5. The arrangement of claim 1 wherein the drive source is further characterized by including waveshaping circuitry operative to determine the waveshape of the primary drive signal.

6. The arrangement of claim 1 wherein the drive source is further characterized in that the waveshape of the primary drive signal is independent of the waveshape of the inverter output voltage.

7. The arrangement of claim 1 wherein the inverter circuit additionally includes an auxiliary signal source connected in circuit with the second pair of control terminals and functional to provide an initiating signal thereto; the initiating signal being distinctly different from the primary drive signal.

8. The arrangement of claim 1 wherein an auxiliary signal source is connected in circuit with the second pair of control terminals and provides an initiating signal thereto; the auxiliary signal source being characterized by providing the initiating signal independently of the drive source.

9. The arrangement of claim 1 wherein the inverter circuit is further characterized by: (i) having a trigger signal input; and (ii) requiring the provision thereto of a trigger signal before actually providing the inverter output voltage at the inverter output terminals.

10. The arrangement of claim 1 wherein the inverter circuit is further characterized by: (i) having a trigger signal input; and (ii) requiring the provision thereto of a trigger signal before actually providing the inverter output voltage.

11. The arrangement of claim 1 wherein the inverter circuit is further characterized by: (i) having a trigger signal input; and (ii) not providing the inverter output voltage until after having received a trigger signal at the trigger signal input.

12. The arrangement of claim 1 wherein: (i) the inverter circuit has a trigger signal input that requires, prior to actually providing the inverter output voltage, to be supplied with a trigger signal; (ii) the DC source includes an auxiliary signal source connected with the trigger signal input and operative to provide the required trigger signal thereto.

13. The arrangement of claim 1 wherein:
   (a) the inverter output voltage has a fundamental frequency; and
   (b) neither the DC source, nor the drive source, nor the inverter circuit, nor the gas discharge lamp includes an L-C circuit with a natural resonance frequency equal to the fundamental frequency.

14. The arrangement of claim 1 additionally characterized in that: (i) it includes a low-voltage supply operable to provide a low-voltage cathode heating voltage at a pair of low-voltage supply terminals; (ii) the gas discharge lamp has a thermionic cathode with a pair of cathode terminals connected with the low-voltage supply terminals; (iii) the RMS magnitude of the low-voltage cathode heating voltage is distinctly higher at a first point in time just prior to lamp ignition as compared with a second point in time just after lamp ignition; and (iv) the RMS magnitude of the inverter output voltage at the first point in time is substantially equal to the RMS magnitude of the inverter output voltage at the second point in time.

15. An arrangement comprising:
a gas discharge lamp having a pair of lamp terminals; and
an AC source having a pair of AC output terminals connected with the lamp terminals; the AC source being conditionally operable to provide an AC output voltage at the AC output terminals; the source being particularly characterized by including (i) a first switching transistor having a first pair of switching control terminals across which exists a first switching control voltage, and (ii) a second switching transistor having a second pair of switching control terminals across which conditionally exists a second switching control voltage; the source being further characterized by (i) having an auxiliary input receptive of an initiating action, and (ii) being operative to cause the existence of the second switching control voltage only after having received said initiating action;
such that, even if the first switching control voltage does exist across the first pair of switching control terminals, until after having received the initiating action, the second switching control voltage does not exist across the second pair of switching control terminals.

16. An arrangement comprising:
a gas discharge lamp having a pair of lamp terminals; and
an AC source having a pair of AC output terminals connected with the lamp terminals; the AC source being conditionally operable to provide an AC output voltage at the AC output terminals; the source being characterized by including:
(a) a primary drive-signal source providing a first primary drive-signal at a first pair of primary drive-signal output terminals;
(b) an initiate-action source operable to provide an initiating action at an initiate-output;
(c) a first primary switching transistor having a first pair of primary switching control terminals connected with the first pair of primary drive-signal output terminals; thereby causing the first primary drive-signal to exist across the first pair of primary switching control terminals; thereby, in turn, to cause the first primary switching transistor to be switched ON and OFF in a periodically alternating manner; and
(d) a first secondary switching transistor having a first pair of secondary switching control terminals connected in circuit with the initiate-output; the first secondary switching transistor remaining switched OFF until after an initiating action has been provided at the initiate-output; whereafter, in out-of-phase synchronism with the first primary transistor, it is caused to be switched ON and OFF in a periodically alternating manner.

17. The arrangement of claim 16 wherein:
the primary drive-signal source also provides a second primary drive-signal at a second pair of primary drive-signal output terminals; and
the AC source additionally includes:

(e) a second primary switching transistor having a second primary pair of switching control terminals connected with the second primary drive-signal output terminals; thereby causing the second primary drive-signal to exist across the second primary pair of switching control terminals; thereby, in turn, to cause the second primary switching transistor to be switched ON and OFF in a periodically alternating manner; and
(d) a second secondary switching transistor having a second pair of secondary switching control terminals connected in circuit with the initiate-output; the second secondary switching transistor remaining switched OFF until after an initiating action has been provided at the initiate-output.

18. An arrangement comprising:
a gas discharge lamp having a pair of lamp terminals;
an initiation source operable to provide an initiating action at an initation output; and
an AC source having an initiation input and a pair of AC output terminals; the AC output terminals being connected with the lamp terminals; the initiation input being connected in communicative relationship with the initiation output; the AC source being operable to provide an AC output voltage at the AC output terminals, but only after having received an initiating action at the initiation input; the AC source being further characterized by including a DC source powering an inverter connected in circuit with the AC output terminals and including a field-effect switching transistor that is periodically switched ON and OFF even prior to the provision of said initiating action.

19. An arrangement comprising:
a gas discharge lamp having lamp terminals; and
an inverter circuit connected with a DC supply voltage; the inverter circuit being conditionally operable to provide an AC voltage at a pair of AC output terminals; the AC output terminals being connected with the lamp terminals, thereby conditionally supplying lamp current to the gas discharge lamp; the inverter circuit being characterized by including (i) a pair of primary switching transistors alternating periodically between being conductive and being non-conductive, and (ii) a pair of secondary switching transistors conditionally alternating periodically between being conductive and being non-conductive; the inverter circuit being additionally characterized by having a mode during which (i) the primary switching transistors do indeed alternate periodically between being conductive and being non-conductive, and (ii) the secondary transistors do not so alternate.

20. The arrangement of claim 19 wherein the inverter circuit is further characterized by having an initiation input requiring to be supplied with an initiation action prior to actually providing the AC voltage.

21. The arrangement of claim 20 additionally including initiation means connected with the initiation input and operative to supply the required initiation action.

22. An arrangement comprising:
a gas discharge lamp having lamp terminals; and
an inverter circuit connected with a DC supply voltage; the inverter circuit being operable, after having been provided with an initiation action at an initiation input, to provide an AC voltage at a pair of AC output terminals; the AC output terminals being connected with the lamp terminals; the inverter circuit being further characterized by including:
(a) a pair of primary switching transistors; the primary switching transistors, even prior to the inverter circuit having been provided with said initiation action at its initiation input, alternating periodically between being conductive and being non-conductive; and
(b) a pair of secondary switching transistors; the secondary switching transistors remaining inactive until the inverter circuit has been provided with said initiation action at its initiation input, whereafter they alternate periodically between being conductive and being non-conductive.

23. An arrangement comprising:
a gas discharge lamp having a first and a second pair of lamp cathode terminals; and
an inverter circuit connected with a DC supply voltage; the inverter circuit being operable to provide a main AC lamp voltage between a pair of main AC output terminals and a cathode heating voltage between a pair of cathode power output terminals; a capacitor means being connected between the main AC output terminals; one of the main AC output terminals being connected with one of the first pair of lamp cathode terminals; the other one of the main AC output terminals being connected with one of the second pair of lamp cathode terminals; the pair of cathode power output terminals being connected with the first pair of lamp cathode terminals; the inverter circuit thereby being functional to properly ignite and power the gas discharge lamp; the inverter circuit being additionally characterized in that: (i) a cathode heating voltage exists between the pair of cathode power output terminals; (ii) the cathode heating voltage has an RMS magnitude that is distinctly higher prior to lamp ignition as compared with after lamp ignition; and (iii) the frequency of the main AC lamp voltage is substantially the same prior to lamp ignition as compared with after lamp ignition; the inverter circuit being otherwise characterized by not including a resonant series-combination of a capacitor and an inductor that is, in effect, parallel-connected with the main AC output terminals.

24. The arrangement of claim 23 wherein the RMS magnitude of the cathode heating voltage is at least 25% lower after lamp ignition as compared with before lamp ignition.

25. An arrangement comprising:
a gas discharge lamp having lamp terminals; and
an inverter circuit connected with a DC supply voltage; the inverter circuit being operable, but only after having been provided with an initiation action at an initiation input, to provide an AC voltage at a pair of AC output terminals; the AC output terminals being connected with the lamp terminals; the inverter circuit being further characterized by including a primary switching transistor; the primary switching transistor, even prior to the inverter circuit having been provided with said initiation action at its initiation input, alternating periodically between being conductive and being non-conductive; the inverter circuit being further characterized in that said initiation action need not be synchronized with the periodic ON/OFF switching of the primary switching transistor.

26. The arrangement of claim 25 wherein the inverter circuit is additionally characterized by including a secondary switching transistor; the secondary switching transistor being non-operational until after the inverter circuit is provided with said initiation action, whereafter it alternates periodically between being conductive and being non-conductive.

27. The arrangement of claim 25 wherein the inverter circuit also includes initiation means connected in communicative relationship with the initiation input and operative to provide the initiation action.

* * * * *